(12) United States Patent
Zhang et al.

(10) Patent No.: US 11,201,211 B2
(45) Date of Patent: Dec. 14, 2021

(54) METHOD OF MANUFACTURING A SUPER JUNCTION STRUCTURE AND SUPER JUNCTION STRUCTURE

(71) Applicant: TAIWAN SEMICONDUCTOR MANUFACTURING COMPANY LTD., Hsinchu (TW)

(72) Inventors: Shuai Zhang, Shanghai (CN); Lian-Jie Li, Shanghai (CN); Zhong-Hao Chen, Shanghai (TW); Feng Han, Shanghai (CN); Jian Wu, Shaghai (CN)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/855,253

(22) Filed: Apr. 22, 2020

(65) Prior Publication Data

US 2020/0251553 A1  Aug. 6, 2020

Related U.S. Application Data

(62) Division of application No. 14/586,453, filed on Dec. 30, 2014, now abandoned.

(30) Foreign Application Priority Data

Nov. 4, 2014   (CN) .......................... 201410614306.6

(51) Int. Cl.
*H01L 29/06* (2006.01)
*H01L 29/78* (2006.01)
(Continued)

(52) U.S. Cl.
CPC .... *H01L 29/0634* (2013.01); *H01L 29/41741* (2013.01); *H01L 29/66734* (2013.01);
(Continued)

(58) Field of Classification Search
CPC ............. H01L 29/7802; H01L 29/7809; H01L 29/7813; H01L 29/66712; H01L 29/66719;
(Continued)

(56) References Cited

U.S. PATENT DOCUMENTS 5,430,316 A   7/1995   Contiero et al.
5,682,048 A   10/1997  Shinohara et al.
(Continued)

FOREIGN PATENT DOCUMENTS

| CN | 2836242    | 11/2006 |
|----|------------|---------|
| CN | 103390545  | 11/2013 |
| CN | 104103693  | 10/2014 |

*Primary Examiner* — Jesse Y Miyoshi
(74) *Attorney, Agent, or Firm* — Hauptman Ham, LLP

(57) ABSTRACT

A method of manufacturing a super junction structure includes etching a material to define a trench, wherein the trench has a tapered profile. The method further includes implanting dopants into sidewalls and a bottom surface of the trench to define a doped region, wherein the doped region surrounds the trench. The method further includes depositing an undoped material into the trench. The method further includes performing a thermal process, wherein the thermal process drives the dopants from the doped region into the undoped material to form a conductive pillar in the trench.

20 Claims, 22 Drawing Sheets

(51) Int. Cl.
  *H01L 29/66* (2006.01)
  *H01L 29/417* (2006.01)
  *H01L 21/225* (2006.01)
  *H01L 21/265* (2006.01)

(52) U.S. Cl.
  CPC ...... *H01L 29/7809* (2013.01); *H01L 29/7813* (2013.01); *H01L 21/2253* (2013.01); *H01L 21/26506* (2013.01); *H01L 21/26513* (2013.01); *H01L 29/66727* (2013.01)

(58) Field of Classification Search
  CPC ........... H01L 29/66734; H01L 29/0634; H01L 21/225; H01L 21/2251; H01L 21/2252; H01L 21/2253
  See application file for complete search history.

(56) References Cited

U.S. PATENT DOCUMENTS

| | | | |
|---|---|---|---|
| 6,001,678 A | | 12/1999 | Takahashi |
| 6,037,633 A | | 3/2000 | Shinohara |
| 6,040,600 A | * | 3/2000 | Uenishi ............ H01L 21/26546 257/330 |
| 6,262,470 B1 | | 7/2001 | Lee et al. |
| 6,291,298 B1 | | 9/2001 | Williams et al. |
| 6,465,843 B1 | | 10/2002 | Hirler et al. |
| 2003/0042555 A1 | | 3/2003 | Kitada et al. |
| 2006/0289928 A1 | | 12/2006 | Takaya et al. |
| 2007/0013000 A1 | | 1/2007 | Shiraishi |
| 2007/0272953 A1 | * | 11/2007 | Hirler ................ H01L 29/0878 257/285 |
| 2008/0064166 A1 | | 3/2008 | Peake |
| 2009/0261350 A1 | | 10/2009 | Yamamoto et al. |
| 2017/0092717 A1 | * | 3/2017 | Meiser ................ H01L 29/7811 |

\* cited by examiner

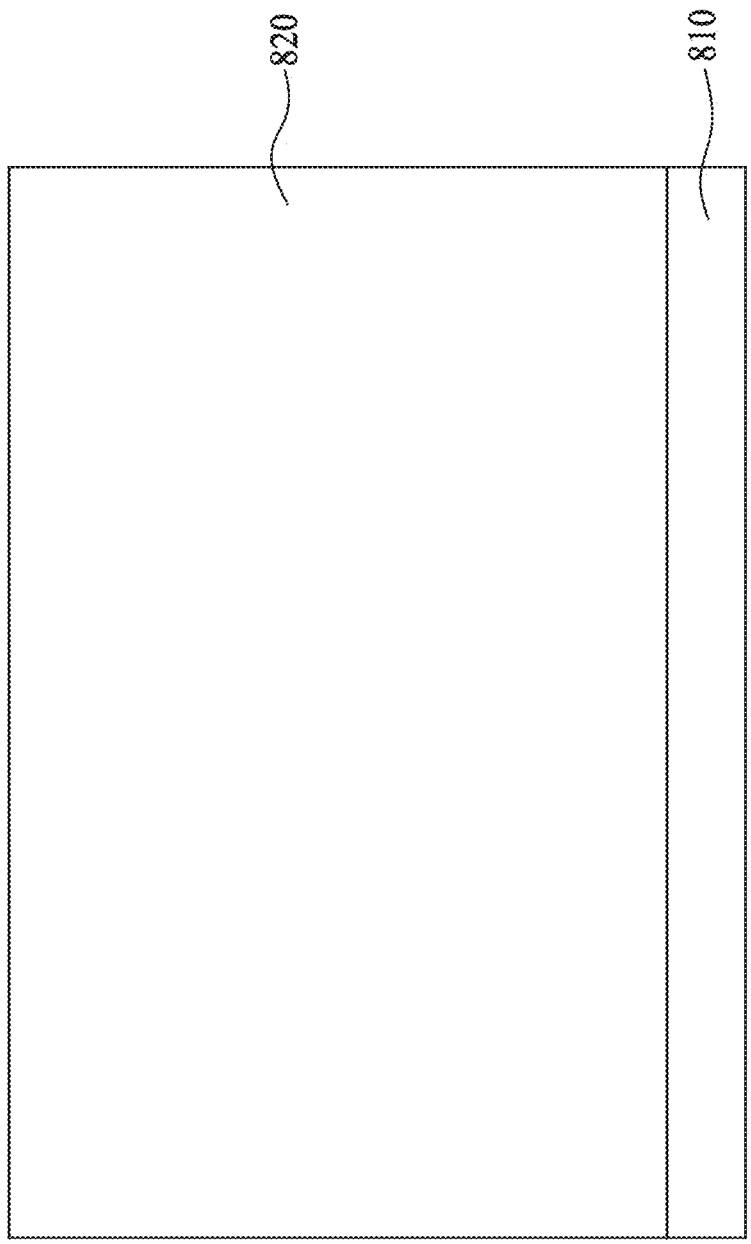

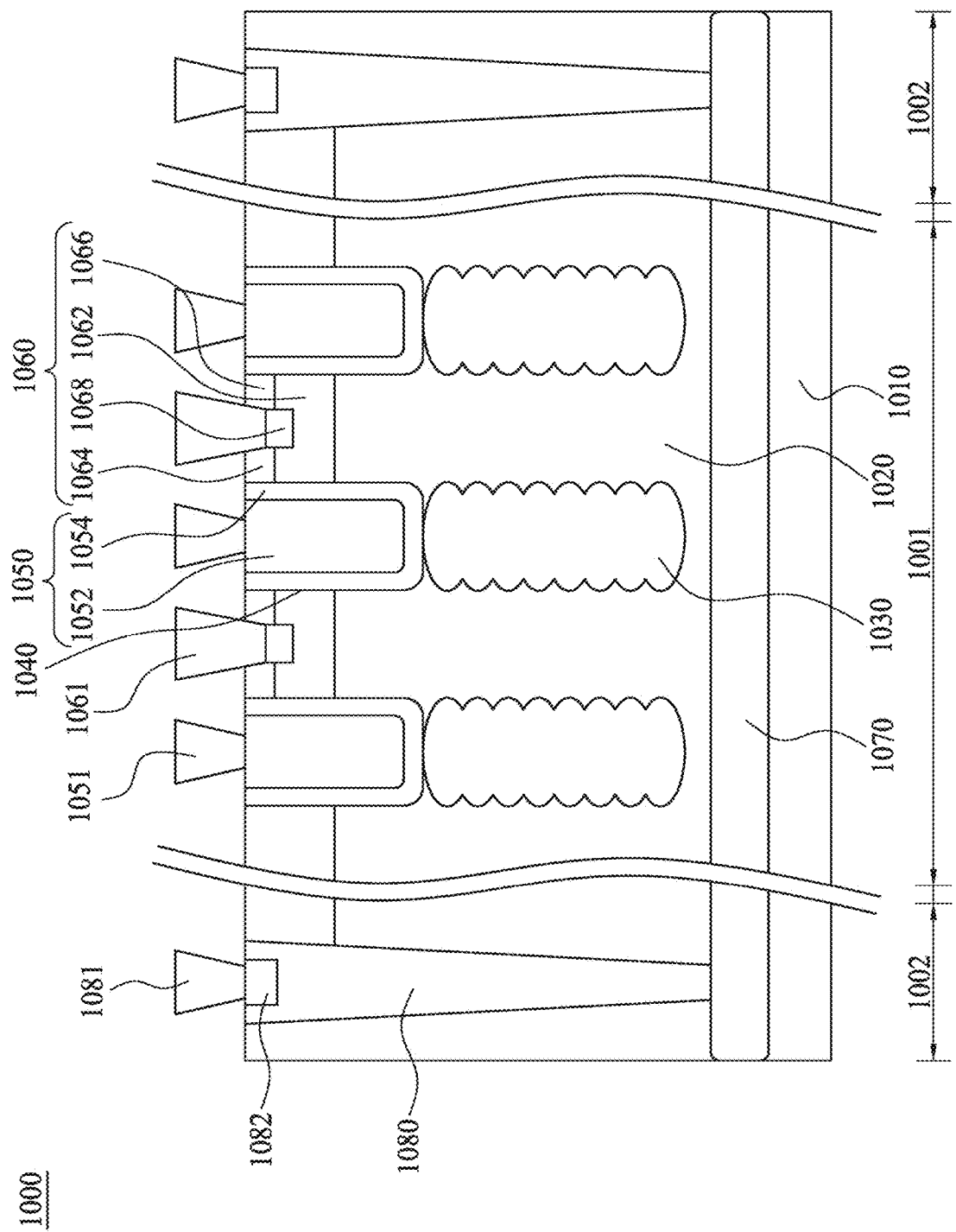

METHOD OF MANUFACTURING A SUPER JUNCTION STRUCTURE AND SUPER JUNCTION STRUCTURE

RELATED APPLICATIONS

This application is a divisional of U.S. application Ser. No. 14/586,453, filed Dec. 30, 2014, which claims priority to Chinese Application Serial Number 201410614306.6, filed Nov. 4, 2014, which are herein incorporated by reference in their entireties.

BACKGROUND

A super junction MOSFET features higher breakdown voltage and lower Rds (i.e., drain-to-source resistance) in view of a typical MOSFET. A super junction structure of the MOSFET is a region of alternating conductivity types in a substrate, such as the super junction structure includes p-type columns and n-type columns alternatively arranged in the substrate.

The p-type columns of the super junction structure are individually under source electrodes of the MOSFET, which however is difficult to have good performance and to integrate the MOSFET in a planar device. On the other hand, concerning the fabrication of the super junction MOSFET, multi-epi and doping processes with masks are required for the p-type columns and n-type columns, which results in poor uniformity, long process time and high cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8E are cross-sectional views at various stages of fabricating a semiconductor device having a super junction structure, in accordance with some embodiments.

FIG. 10 is a cross-sectional view of a semiconductor device having a super junction structure, in accordance with some embodiments.

DETAILED DESCRIPTION

Figure 1:
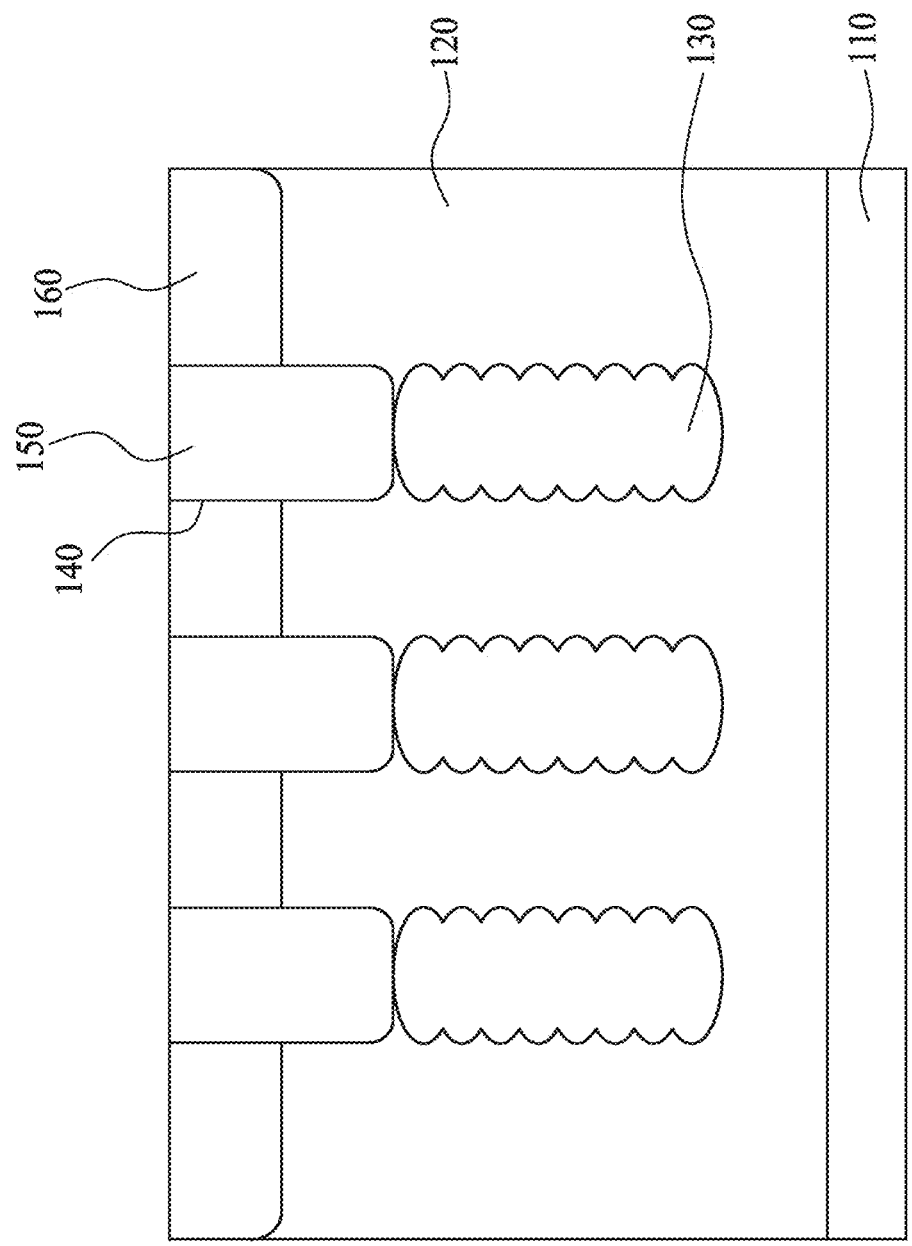
FIGS. 1-7 are cross-sectional views of semiconductor devices having a super junction structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe e one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned, the p-type columns of the super junction structure are individually under source electrodes of the MOSFET, which however is difficult to have good performance and integrate the MOSFET in a planar device. Further, the p-type columns and n-type columns are fabricated by multi-epi and doping processes with masks, which however results in poor uniformity, long process time and high cost. To address the above issue, a semiconductor device having a super junction structure, a method for manufacturing the semiconductor device and a method for manufacturing the super junction structure are provided.

Compared with the p-type columns of the super junction structure individually under source electrodes of the MOSFET, the semiconductor device of the present disclosure includes a pillar under a gate trench, which has better performance and makes it possible to integrate semiconductor device in a planar device. In addition, the method for manufacturing the super junction structure, in accordance with the present disclosure, includes forming a trench and a pillar of a conductivity type from an undoped material in the trench, which exhibits better uniformity, less process time and lower cost compared with fabrication of a super junction structure by the multi-epi process.

Embodiments of the semiconductor device having the super junction structure, the method for manufacturing the semiconductor device and the method for manufacturing the super junction structure are sequentially described below in detail.

FIG. 1 is a cross-sectional view of a semiconductor device 100 having a super junction structure, in accordance with some embodiments. In FIG. 1, the semiconductor device 100 having a super junction structure includes a substrate 110, an epitaxial layer 120, a plurality of pillars 130, a plurality of gate trenches 140, an insulating layer 150 and a plurality of doped wells 160.

In some embodiments of the present disclosure, the substrate 110 is a doped substrate of the first conductivity type. In some embodiments of the present disclosure, the substrate 110 is an n-doped substrate. In some embodiments of the present disclosure, the n-type dopant includes, but not limited to, arsenic, phosphorous, another suitable n-type dopant or a combination thereof. In some embodiments of the present disclosure, the substrate 110 is a heavily doped substrate. In some embodiments of the present disclosure, the substrate 110 is acted as a drain electrode. In some embodiments of the present disclosure, the substrate 110 includes, but not limited to, an elementary semiconductor including silicon or germanium in crystal, polycrystalline or an amorphous structure; a compound semiconductor including silicon carbide, gallium arsenide, gallium phosphide, indium phosphide, indium arsenide, indium antimonide or a combination thereof; an alloy semiconductor including SiGe, GaAsP, AlInAs, AlGaAs, GaInAs, GaInP, GaInAsP or a combination thereof; any other suitable material or combinations thereof.

The epitaxial layer 120 of a first conductivity type is on the substrate 110. In some embodiments of the present disclosure, the epitaxial layer 120 is an n-doped epitaxial (n-epi) layer. In some embodiments of the present disclosure, the epitaxial layer 120 includes silicon, germanium, another suitable n-type semiconductor material or the combination thereof.

The pillars 130 of a second conductivity type are in the epitaxial layer 120. In some embodiments of the present disclosure, the second conductivity type is opposite to the first conductivity type. In some embodiments of the present disclosure, the pillars 130 are p-doped pillars. In some embodiments of the present disclosure, the pillars 130 include p-type dopants and thus can be acted as a p-type column. In some embodiments of the present disclosure, the p-type dopants in the pillars 130 include boron, boron difluoride, another suitable p-type dopant or a combination thereof.

In some embodiments of the present disclosure, each of the pillars 130 is a multilayer structure. In some embodiments of the present disclosure, the multilayer structure is a multilayer of the second conductivity type. In some embodiments of the present disclosure, each of the pillars 130 is a p-doped multilayer structure. In some embodiments of the present disclosure, the multilayer structure of the pillars 130 is fabricated by multi-epi and doping processes with masks.

The gate trenches 140 are individually correspond to and over the pillars 130, and the insulating layer 150 is in the gate trenches 140. In some embodiments of the present disclosure, the pillars 130 are individually in contact with the insulating layer 150 in the gate trenches 140. In some embodiments of the present disclosure, the insulating layer 150 includes a conductive material such as polysilicon or another suitable conductive material. In some embodiments of the present disclosure, the insulating layer 150 includes a dielectric material, such as silicon dioxide, a silicon nitride or another suitable dielectric material. In some embodiments of the present disclosure, the insulating layer 150 is an air gap. In some embodiments of the present disclosure, the insulating layer 150 can be acted as a gate insulating layer and in contact with a gate electrode.

In some embodiments of the present disclosure, the semiconductor device 100 further includes another insulating layer between the insulating layer 150 and an inner surface of the gate trenches 140. In some embodiments of the present disclosure, the additional insulating layer includes silicon dioxide, aerogel, silicon nitride, silicon oxynitride, another suitable insulating material or a combination thereof.

The doped wells 160 of the second conductivity type are in the epitaxial layer 120. In some embodiments of the present disclosure, each of the doped wells 160 is between two adjacent gate trenches 140. In some embodiments of the present disclosure, the doped wells 160 are p-doped wells. In some embodiments of the present disclosure, the doped wells 160 include p-type dopants and thus can be acted as a p-type semiconductor wells. In some embodiments of the present disclosure, each of the doped wells 160 is in contact with a source electrode. In some embodiments of the present disclosure, the p-type dopants in the doped wells 160 include boron, boron difluoride, another suitable p-type dopant or a combination thereof.

Figure 2:
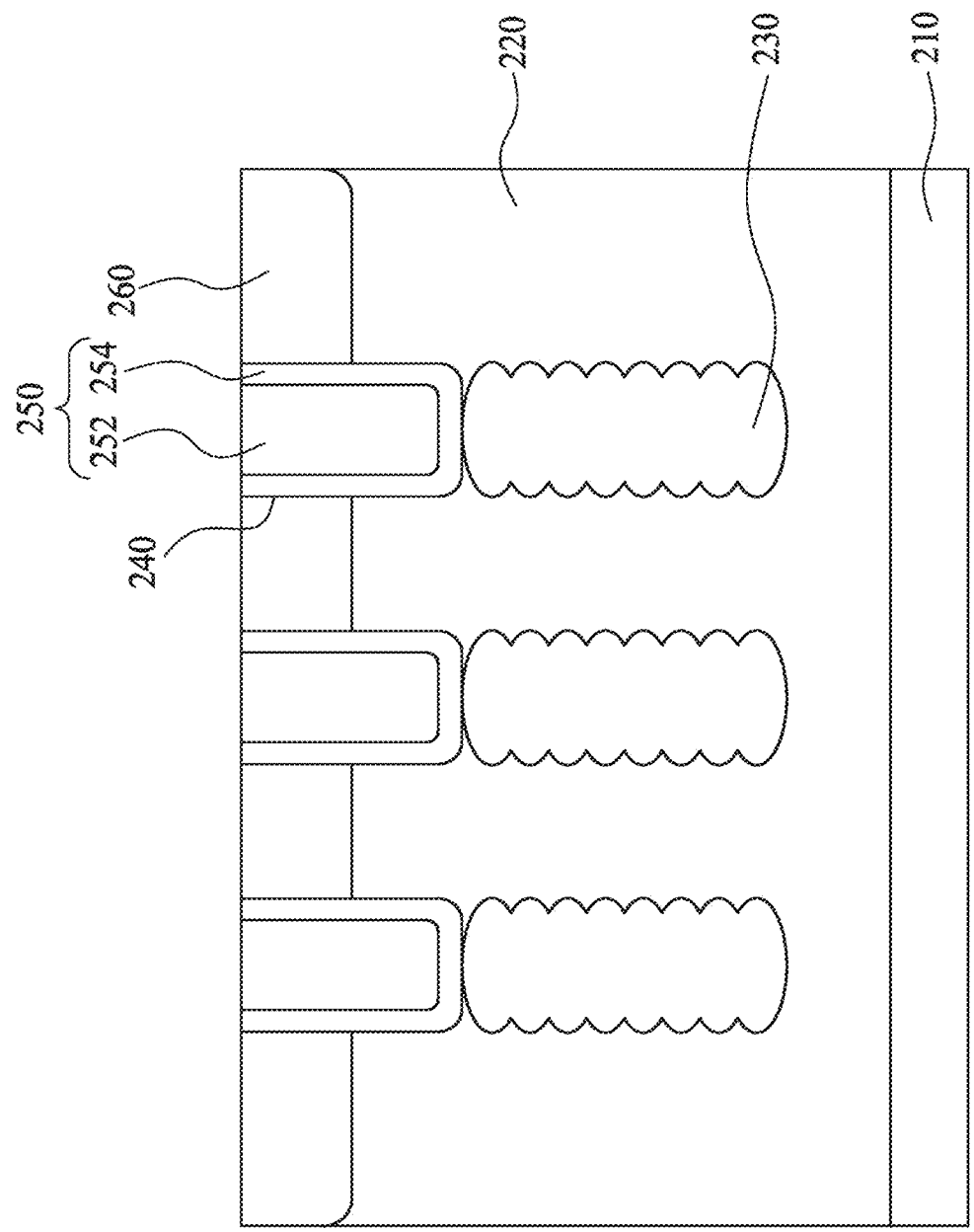

FIG. 2 is a cross-sectional view of a semiconductor device 200 having a super junction structure, in accordance with some embodiments. In FIG. 2, the semiconductor device 200 having a super junction structure includes a substrate 210, an epitaxial layer 220, a plurality of pillars 230, a plurality of gate trenches 240, an insulating layer 250 and a plurality of doped wells 260.

In some embodiments of the present disclosure, the substrate 210 is a doped substrate of the first conductivity type. In some embodiments of the present disclosure, the substrate 210 is acted as a drain electrode. The epitaxial layer 220 of a first conductivity type is on the substrate 210. In some embodiments of the present disclosure, the epitaxial layer 220 is an n-epi layer.

The pillars 230 of a second conductivity type are in the epitaxial layer 220. In some embodiments of the present disclosure, the second conductivity type is opposite to the first conductivity type. In some embodiments of the present disclosure, the pillars 230 are p-doped pillars. In some embodiments of the present disclosure, the pillars 230 include p-type dopants and thus can be acted as a p-type column. In some embodiments of the present disclosure, each of the pillars 230 is a multilayer structure. In some embodiments of the present disclosure, the multilayer structure is a multilayer of the second conductivity type. In some embodiments of the present disclosure, each of the pillars 230 is a p-doped multilayer structure.

The gate trenches 240 are individually correspond to and over the pillars 230, and the insulating layer 250 is in the gate trenches 240. In some embodiments of the present disclosure, the pillars 230 are individually in contact with the insulating layer 250 in the gate trenches 240. In some embodiments of the present disclosure, the insulating layer 250 includes an oxide layer 254 disposed on an inner surface of the gate trenches 240; and a polymer material 252 disposed on the oxide layer 254 and in the gate trenches 240. In some embodiments of the present disclosure, the polymer material 252 includes a conductive material such as polysilicon or another suitable conductive material. In some embodiments of the present disclosure, the polymer material 252 and the oxide layer 254 individually include a dielectric material, such as silicon dioxide, a silicon nitride or another suitable dielectric material. In some embodiments of the present disclosure, the polymer material 252 includes an air gap. In some embodiments of the present disclosure, the insulating layer 250 can be acted as a gate insulating layer and in contact with a gate electrode.

In some embodiments of the present disclosure, the semiconductor device 200 further includes another insulating layer between the insulating layer 250 and an inner surface of the gate trenches 240. In some embodiments of the present disclosure, the additional insulating layer includes silicon dioxide, aerogel, silicon nitride, silicon oxynitride, another suitable insulating material or a combination thereof.

The doped wells 260 of the second conductivity type are in the epitaxial layer 220. In some embodiments of the present disclosure, each of the doped wells 260 is between two adjacent gate trenches 240. In some embodiments of the present disclosure, the doped wells 260 are p-doped wells. In some embodiments of the present disclosure, the doped wells 260 include p-type dopants and thus can be acted as a p-type semiconductor wells. In some embodiments of the present disclosure, each of the doped wells 260 is in contact with a source electrode.

Figure 3:
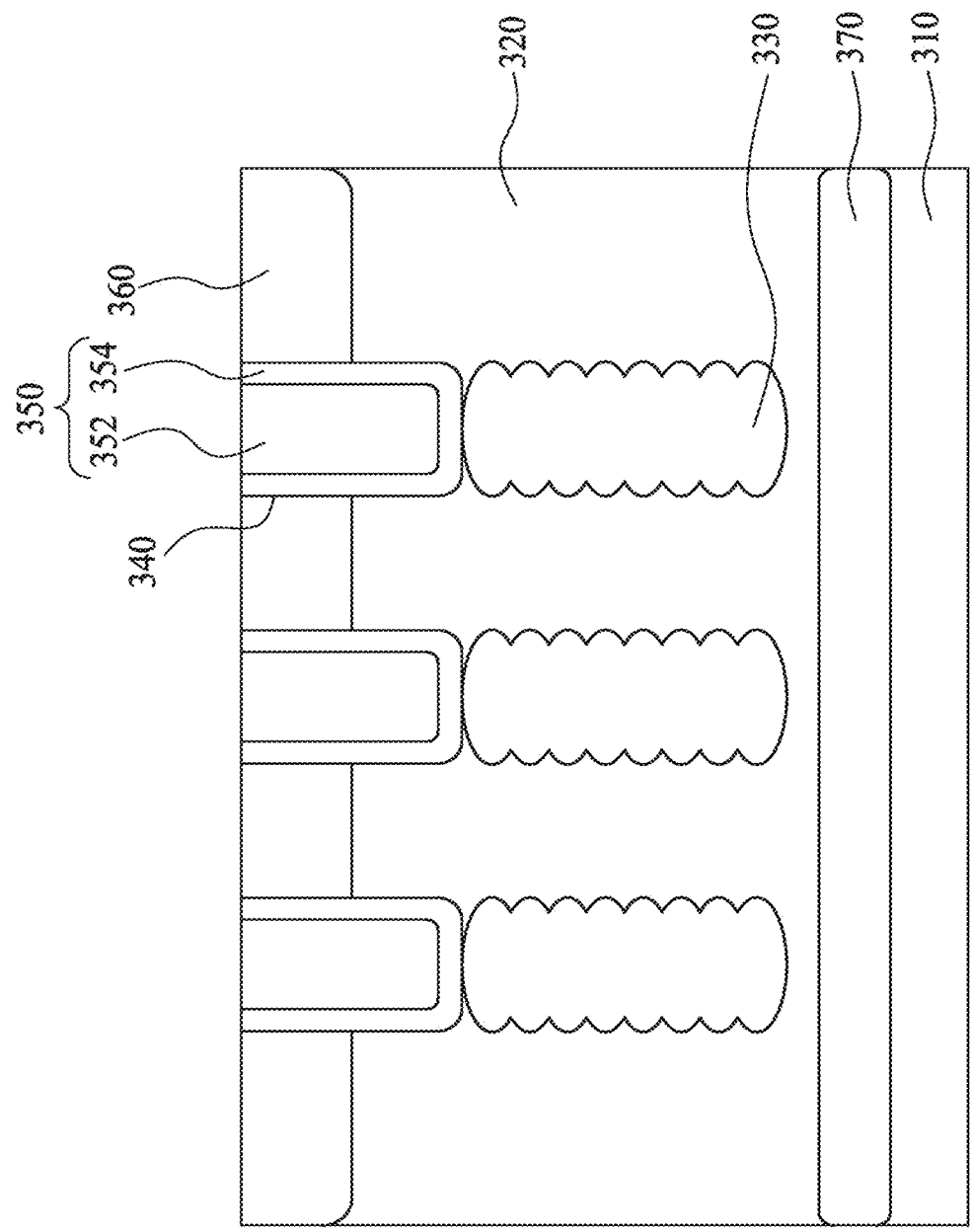

FIG. 3 is a cross-sectional view of a semiconductor device 300 having a super junction structure, in accordance with some embodiments. In FIG. 3, the semiconductor device 300 having a super junction structure includes a substrate 310, an epitaxial layer 320, a plurality of pillars 330, a plurality of gate trenches 340, an insulating layer 350, a plurality of doped wells 360 and a bury layer 370.

In some embodiments of the present disclosure, the substrate 310 is a doped substrate of the second conductivity type. In some embodiments of the present disclosure, the substrate 310 is a p-doped substrate. In some embodiments of the present disclosure, the substrate 310 includes p-type dopants and thus can be acted as a p-type base. In some embodiments of the present disclosure, the p-type dopants in the substrate 310 include boron, boron difluoride, another suitable p-type dopant or a combination thereof. The epitaxial layer 320 of a first conductivity type is on the substrate 310. In some embodiments of the present disclosure, the epitaxial layer 320 is an n-epi layer.

The bury layer 370 of the first conductivity type is between the substrate 310 and epitaxial layer 320. In some embodiments of the present disclosure, the bury layer 370 is an n-doped bury layer. In some embodiments of the present disclosure, the bury layer 370 includes silicon, germanium, another suitable n-type semiconductor material or the combination thereof. In some embodiments of the present disclosure, the bury layer 370 is acted as an interlayer to conduct from a top source electrode to a top drain.

The pillars 330 of a second conductivity type are in the epitaxial layer 320. In some embodiments of the present disclosure, the second conductivity type is opposite to the first conductivity type. In some embodiments of the present disclosure, the pillars 330 are p-doped pillars. In some embodiments of the present disclosure, the pillars 330 include p-type dopants and thus can be acted as a p-type column. In some embodiments of the present disclosure, each of the pillars 330 is a multilayer structure. In some embodiments of the present disclosure, the multilayer structure is a multilayer of the second conductivity type. In some embodiments of the present disclosure, each of the pillars 330 is a p-doped multilayer structure.

The gate trenches 340 are individually correspond to and over the pillars 330, and the insulating layer 350 is in the gate trenches 340. In some embodiments of the present disclosure, the pillars 330 are individually in contact with the insulating layer 350 in the gate trenches 340. In some embodiments of the present disclosure, the insulating layer 350 includes an oxide layer 354 disposed on an inner surface of the gate trenches 340; and a polymer material 352 disposed on the oxide layer 354 and in the gate trenches 340. In some embodiments of the present disclosure, the insulating layer 350 can be acted as a gate insulating layer and in contact with a gate electrode. In some embodiments of the present disclosure, the semiconductor device 300 further includes another insulating layer between the insulating layer 350 and an inner surface of the gate trenches 340.

The doped wells 360 of the second conductivity type are in the epitaxial layer 320. In some embodiments of the present disclosure, each of the doped wells 360 is between two adjacent gate trenches 340. In some embodiments of the present disclosure, the doped wells 360 are p-doped wells. In some embodiments of the present disclosure, the doped wells 360 include p-type dopants and thus can be acted as a p-type semiconductor wells. In some embodiments of the present disclosure, each of the doped wells 360 is in contact with a source electrode.

Figure 4:
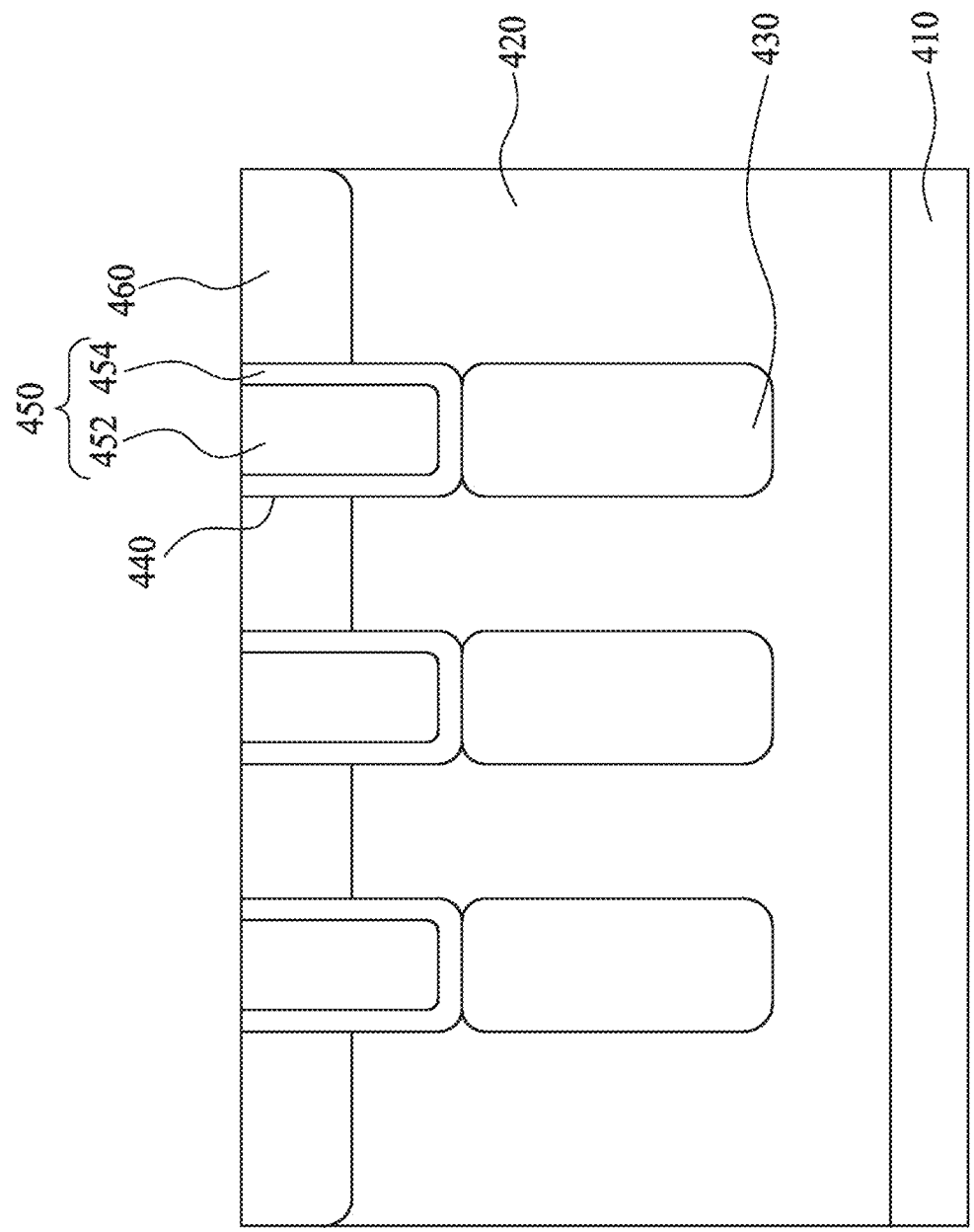

FIG. 4 is a cross-sectional view of a semiconductor device 400 having a super junction structure, in accordance with some embodiments. In FIG. 4, the semiconductor device 400 having a super junction structure includes a substrate 410, an epitaxial layer 420, a plurality of pillars 430, a plurality of gate trenches 440, an insulating layer 450 and a plurality of doped wells 460.

In some embodiments of the present disclosure, the substrate 410 is a doped substrate of the first conductivity type. In some embodiments of the present disclosure, the substrate 410 is acted as a drain electrode. The epitaxial layer 420 of a first conductivity type is on the substrate 410. In some embodiments of the present disclosure, the epitaxial layer 420 is an n-epi layer.

The pillars 430 of a second conductivity type are in the epitaxial layer 420. In some embodiments of the present disclosure, the second conductivity type is opposite to the first conductivity type. In some embodiments of the present disclosure, the pillars 430 are p-doped pillars. In some embodiments of the present disclosure, the pillars 430 include p-type dopants and thus can be acted as a p-type column. In some embodiments of the present disclosure, each of the pillars 430 is a trench filled with the second conductivity type material. In some embodiments of the present disclosure, the trench has a same pattern as that of the gate trenches.

The gate trenches 440 are individually correspond to and over the pillars 430, and the insulating layer 450 is in the gate trenches 440. In some embodiments of the present disclosure, the pillars 430 are individually in contact with the insulating layer 450 in the gate trenches 440. In some embodiments of the present disclosure, the insulating layer 450 includes an oxide layer 454 disposed on an inner surface of the gate trenches 440; and a polymer material 452 disposed on the oxide layer 454 and in the gate trenches 440. In some embodiments of the present disclosure, the polymer material 452 includes a conductive material such as polysilicon or another suitable conductive material. In some embodiments of the present disclosure, the polymer material 452 and the oxide layer 454 individually include a dielectric material, such as silicon dioxide, a silicon nitride or another suitable dielectric material. In some embodiments of the present disclosure, the polymer material 452 includes an air gap. In some embodiments of the present disclosure, the insulating layer 450 can be acted as a gate insulating layer and in contact with a gate electrode. In some embodiments of the present disclosure, the semiconductor device 400 further includes another insulating layer between the insulating layer 450 and an inner surface of the gate trenches 440.

The doped wells 460 of the second conductivity type are in the epitaxial layer 420. In some embodiments of the present disclosure, each of the doped wells 460 is between two adjacent gate trenches 440. In some embodiments of the present disclosure, the doped wells 460 are p-doped wells. In some embodiments of the present disclosure, the doped wells 460 include p-type dopants and thus can be acted as a p-type semiconductor wells. In some embodiments of the present disclosure, each of the doped wells 460 is in contact with a source electrode.

Figure 5:
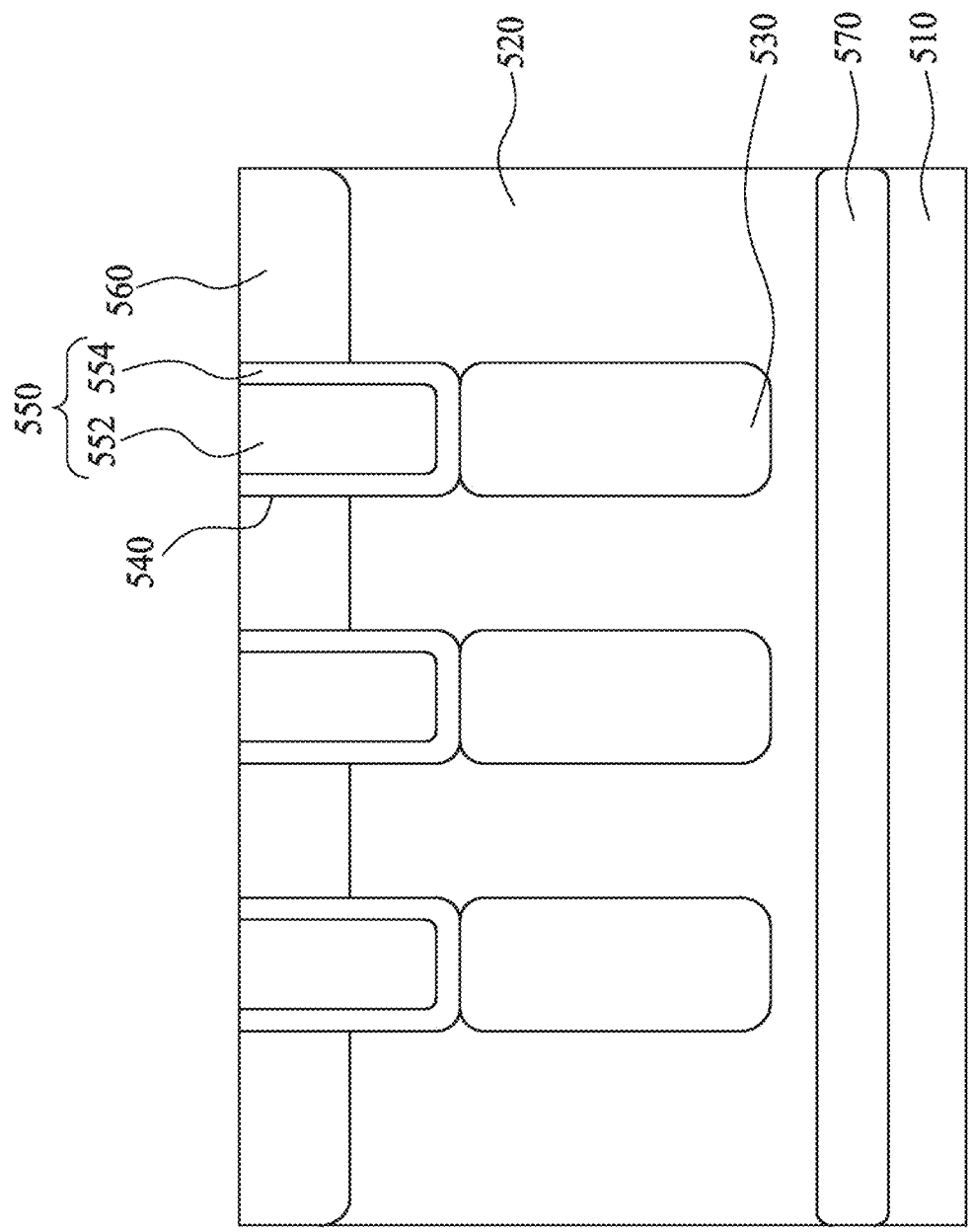

FIG. 5 is a cross-sectional view of a semiconductor device 500 having a super junction structure, in accordance with some embodiments. In FIG. 5, the semiconductor device 500 having a super junction structure includes a substrate 510, an epitaxial layer 520, a plurality of pillars 530, a plurality of gate trenches 540, an insulating layer 550, a plurality of doped wells 560 and a bury layer 570.

In some embodiments of the present disclosure, the substrate 510 is a doped substrate of the second conductivity type. In some embodiments of the present disclosure, the substrate 510 is a p-doped substrate. In some embodiments of the present disclosure, the substrate 510 includes p-type dopants and thus can be acted as a p-type base. The epitaxial layer 520 of a first conductivity type is on the substrate 510. In some embodiments of the present disclosure, the epitaxial layer 520 is an n-epi layer.

The bury layer 570 of the first conductivity type is between the substrate 510 and epitaxial layer 520. In some embodiments of the present disclosure, the bury layer 570 is an n-doped bury layer. In some embodiments of the present disclosure, the bury layer 570 is acted as an interlayer to conduct from a top source electrode to a top drain.

The pillars 530 of a second conductivity type are in the epitaxial layer 520. In some embodiments of the present disclosure, the second conductivity type is opposite to the first conductivity type. In some embodiments of the present disclosure, the pillars 530 are p-doped pillars. In some embodiments of the present disclosure, the pillars 530 include p-type dopants and thus can be acted as a p-type column. In some embodiments of the present disclosure, each of the pillars 530 is a trench filled with the second conductivity type material. In some embodiments of the present disclosure, the trench has a same pattern as that of the gate trenches.

The gate trenches 540 are individually correspond to and over the pillars 530, and the insulating layer 550 is in the gate trenches 540. In some embodiments of the present disclosure, the pillars 530 are individually in contact with the insulating layer 550 in the gate trenches 540. In some embodiments of the present disclosure, the insulating layer 550 includes an oxide layer 554 disposed on an inner surface of the gate trenches 540; and a polymer material 552 disposed on the oxide layer 554 and in the gate trenches 540. In some embodiments of the present disclosure, the polymer material 552 includes an air gap. In some embodiments of the present disclosure, the insulating layer 550 can be acted as a gate insulating layer and in contact with a gate electrode. In some embodiments of the present disclosure, the semiconductor device 500 further includes another insulating layer between the insulating layer 550 and an inner surface of the gate trenches 540.

The doped wells 560 of the second conductivity type are in the epitaxial layer 520. In some embodiments of the present disclosure, each of the doped wells 560 is between two adjacent gate trenches 540. In some embodiments of the present disclosure, the doped wells 560 are p-doped wells. In some embodiments of the present disclosure, the doped wells 560 include p-type dopants and thus can be acted as a p-type semiconductor wells. In some embodiments of the present disclosure, each of the doped wells 560 is in contact with a source electrode.

Figure 6:
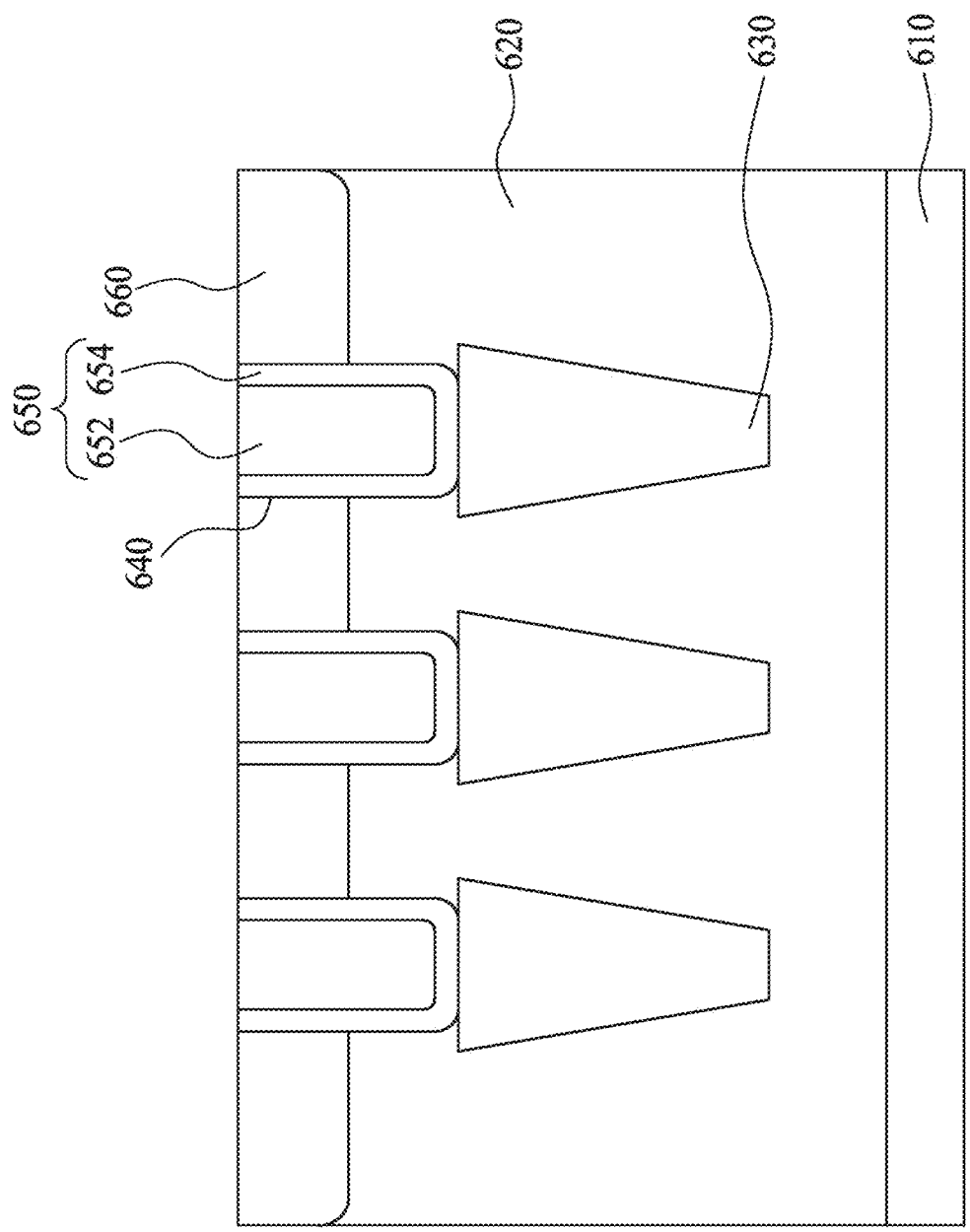

FIG. 6 is a cross-sectional view of a semiconductor device 600 having a super junction structure, in accordance with some embodiments. In FIG. 6, the semiconductor device 600 having a super junction structure includes a substrate 610, an epitaxial layer 620, a plurality of pillars 630, a plurality of gate trenches 640, an insulating layer 650 and a plurality of doped wells 660.

In some embodiments of the present disclosure, the substrate 610 is a doped substrate of the first conductivity type. In some embodiments of the present disclosure, the substrate 610 is acted as a drain electrode. The epitaxial layer 620 of a first conductivity type is on the substrate 610. In some embodiments of the present disclosure, the epitaxial layer 620 is an n-epi layer.

The pillars 630 of a second conductivity type are in the epitaxial layer 620. In some embodiments of the present disclosure, the second conductivity type is opposite to the first conductivity type. In some embodiments of the present disclosure, the pillars 630 are p-doped pillars. In some embodiments of the present disclosure, the pillars 630 include p-type dopants and thus can be acted as a p-type column. In some embodiments of the present disclosure, each of the pillars 630 is a trench filled with the second conductivity type material. In some embodiments of the present disclosure, the trench is an angled trench. In some embodiments of the present disclosure, the trench has a same pattern as that of the gate trenches.

The gate trenches 640 are individually correspond to and over the pillars 630, and the insulating layer 650 is in the gate trenches 640. In some embodiments of the present disclosure, the pillars 630 are individually in contact with the insulating layer 650 in the gate trenches 640. In some embodiments of the present disclosure, the insulating layer 650 includes an oxide layer 654 disposed on an inner surface of the gate trenches 640; and a polymer material 652 disposed on the oxide layer 654 and in the gate trenches 640. In some embodiments of the present disclosure, the polymer material 652 includes a conductive material such as polysilicon or another suitable conductive material. In some embodiments of the present disclosure, the polymer material 652 and the oxide layer 654 individually include a dielectric material, such as silicon dioxide, a silicon nitride or another suitable dielectric material. In some embodiments of the present disclosure, the polymer material 652 includes an air gap. In some embodiments of the present disclosure, the insulating layer 650 can be acted as a gate insulating layer and in contact with a gate electrode. In some embodiments of the present disclosure, the semiconductor device 600 further includes another insulating layer between the insulating layer 650 and an inner surface of the gate trenches 640.

The doped wells 660 of the second conductivity type are in the epitaxial layer 620. In some embodiments of the present disclosure, each of the doped wells 660 is between two adjacent gate trenches 640. In some embodiments of the present disclosure, the doped wells 660 are p-doped wells. In some embodiments of the present disclosure, the doped wells 660 include p-type dopants and thus can be acted as a p-type semiconductor wells. In some embodiments of the present disclosure, each of the doped wells 660 is in contact with a source electrode.

Figure 7:
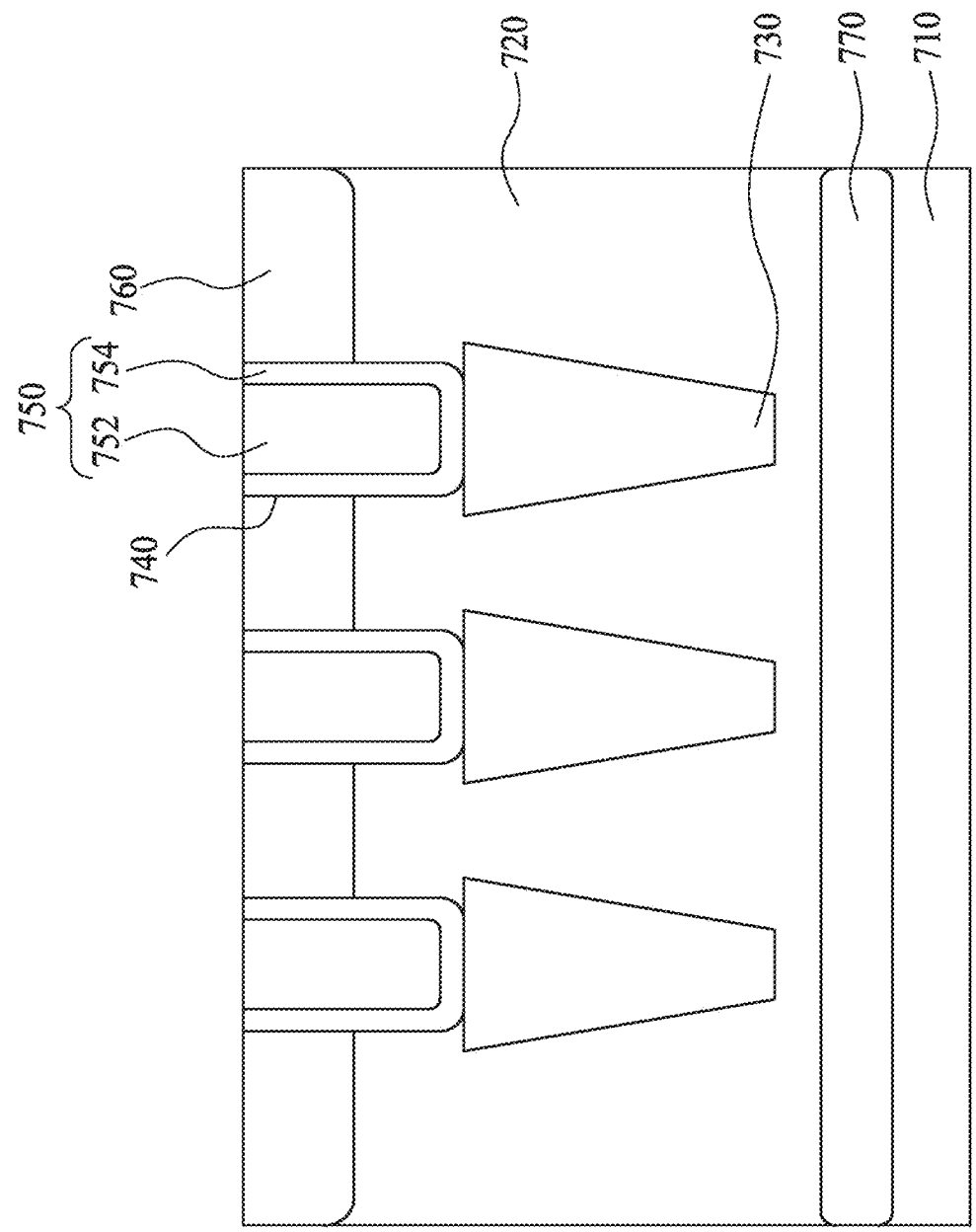

FIG. 7 is a cross-sectional view of a semiconductor device 700 having a super junction structure, in accordance with some embodiments. In FIG. 7, the semiconductor device 700 having a super junction structure includes a substrate 710, an epitaxial layer 720, a plurality of pillars 730, a plurality of gate trenches 740, an insulating layer 750, a plurality of doped wells 760 and a bury layer 770.

In some embodiments of the present disclosure, the substrate 710 is a doped substrate of the second conductivity type. In some embodiments of the present disclosure, the substrate 710 is a p-doped substrate. In some embodiments of the present disclosure, the substrate 710 includes p-type dopants and thus can be acted as a p-type base. The epitaxial layer 720 of a first conductivity type is on the substrate 710. In some embodiments of the present disclosure, the epitaxial layer 720 is an n-epi layer.

The bury layer 770 of the first conductivity type is between the substrate 710 and epitaxial layer 720. In some embodiments of the present disclosure, the bury layer 770 is an n-doped bury layer. In some embodiments of the present disclosure, the bury layer 770 is acted as an interlayer to conduct from a top source electrode to a top drain.

The pillars 730 of a second conductivity type are in the epitaxial layer 720. In some embodiments of the present disclosure, the second conductivity type is opposite to the first conductivity type. In some embodiments of the present disclosure, the pillars 730 are p-doped pillars. In some embodiments of the present disclosure, the pillars 630 include p-type dopants and thus can be acted as a p-type column. In some embodiments of the present disclosure, each of the pillars 730 is a trench filled with the second conductivity type material. In some embodiments of the present disclosure, the trench is an angled trench. In some embodiments of the present disclosure, the trench has a same pattern as that of the gate trenches.

The gate trenches 740 are individually correspond to and over the pillars 730, and the insulating layer 750 is in the gate trenches 740. In some embodiments of the present disclosure, the pillars 730 are individually in contact with the insulating layer 750 in the gate trenches 740. In some embodiments of the present disclosure, the insulating layer 750 includes an oxide layer 754 disposed on an inner surface of the gate trenches 740; and a polymer material 752 disposed on the oxide layer 754 and in the gate trenches 740. In some embodiments of the present disclosure, the polymer material 752 includes a conductive material such as polysilicon or another suitable conductive material. In some embodiments of the present disclosure, the polymer material 752 and the oxide layer 754 individually include a dielectric material, such as silicon dioxide, a silicon nitride or another suitable dielectric material. In some embodiments of the present disclosure, the polymer material 752 includes an air gap. In some embodiments of the present disclosure, the insulating layer 750 can be acted as a gate insulating layer and in contact with a gate electrode. In some embodiments of the present disclosure, the semiconductor device 700 further includes another insulating layer between the insulating layer 750 and an inner surface of the gate trenches 740.

The doped wells 660 of the second conductivity type are in the epitaxial layer 720. In some embodiments of the present disclosure, each of the doped wells 760 is between two adjacent gate trenches 740. In some embodiments of the present disclosure, the doped wells 760 are p-doped wells. In some embodiments of the present disclosure, the doped wells 760 include p-type dopants and thus can be acted as a p-type semiconductor wells. In some embodiments of the present disclosure, each of the doped wells 760 is in contact with a source electrode.

FIGS. 8A-8E are cross-sectional views at various stages of fabricating a semiconductor device 800 having a super junction structure, in accordance with some embodiments.

As shown in FIG. 8A, a substrate 810 is provided, and an epitaxial layer 820 of a first conductivity type is then formed on the substrate 810. The epitaxial layer 820 is formed on the substrate 810 by an epitaxial process. In some embodiments of the present disclosure, the epitaxial layer 820 is a first conductivity type. In some embodiments of the present disclosure, the epitaxial layer 820 is formed an n-type epitaxial layer. In some embodiments of the present disclosure, the epitaxial layer 820 is doped by introducing dopants during the formation of the epitaxial layer 820. In some embodiments of the present disclosure, the epitaxial layer 820 is doped after formation of the epitaxial layer 820.

In some embodiments of the present disclosure, a bury layer of the first conductivity type is formed between the substrate 810 and the epitaxial layer 820. In some embodiments of the present disclosure, the bury layer is formed an n-doped bury layer. In some embodiments of the present disclosure, the bury layer is formed of silicon, germanium, another suitable n-type semiconductor material or the combination thereof. In some embodiments of the present disclosure, the bury layer is formed to be acted as an interlayer to conduct from a top source electrode to a top drain. In some embodiments of the present disclosure, the bury layer is formed by a chemical vapor deposition (CVD) process, a physical vapor deposition (PVD) process, spin-on coating, another suitable formation process or a combination thereof.

Figure 8B:
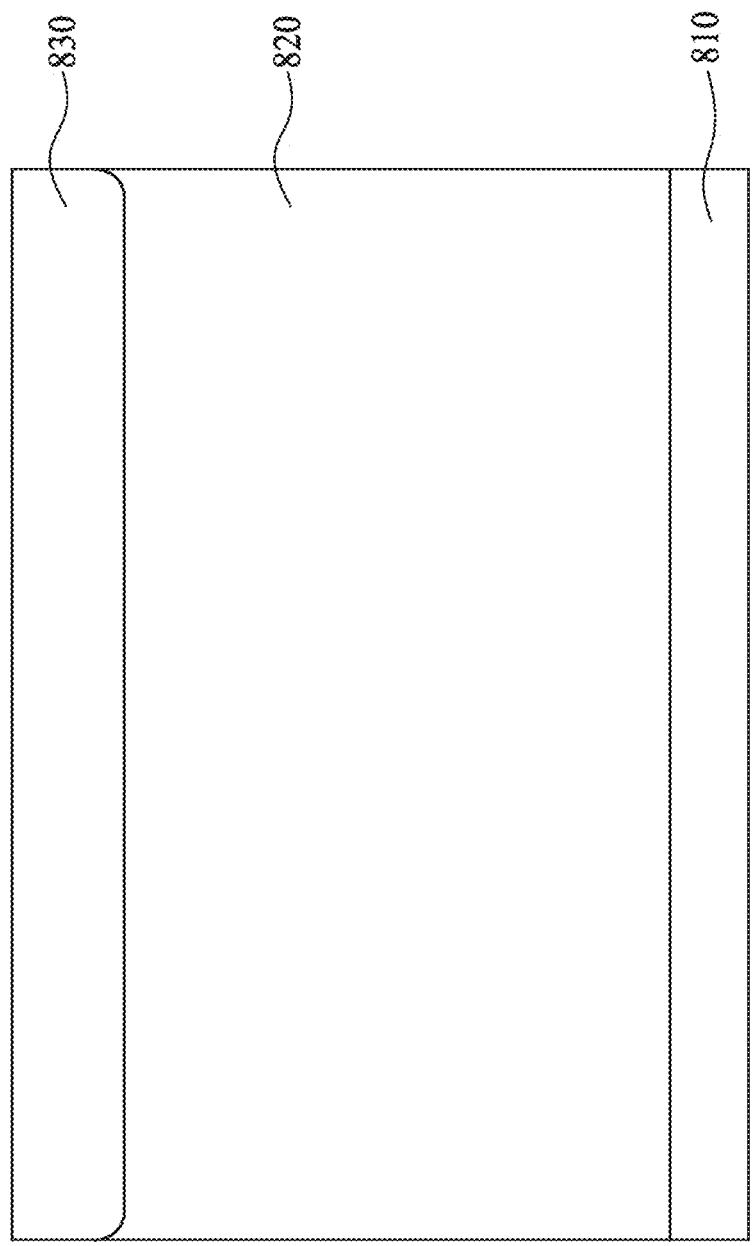

Referring to FIG. 8B, ion implantation is performed to deposit dopants of a second conductivity type into the epitaxial layer 820, so as to form a doped layer 830 of the second conductivity type in the epitaxial layer 820. In some embodiments of the present disclosure, a vertical ion implantation process is performed on the epitaxial layer 820. In some embodiments of the present disclosure, a tilt ion implantation process is performed on the epitaxial layer 820. In some embodiments of the present disclosure, the doped layer 830 is a second conductivity type opposite to the first conductivity type. In some embodiments of the present disclosure, the ion implantation deposits p-type dopants into the epitaxial layer 820. In some embodiments of the present disclosure, the p-type dopants include, but not limited to, boron, boron difluoride, another suitable p-type dopant, or a combination thereof.

Figure 8C:
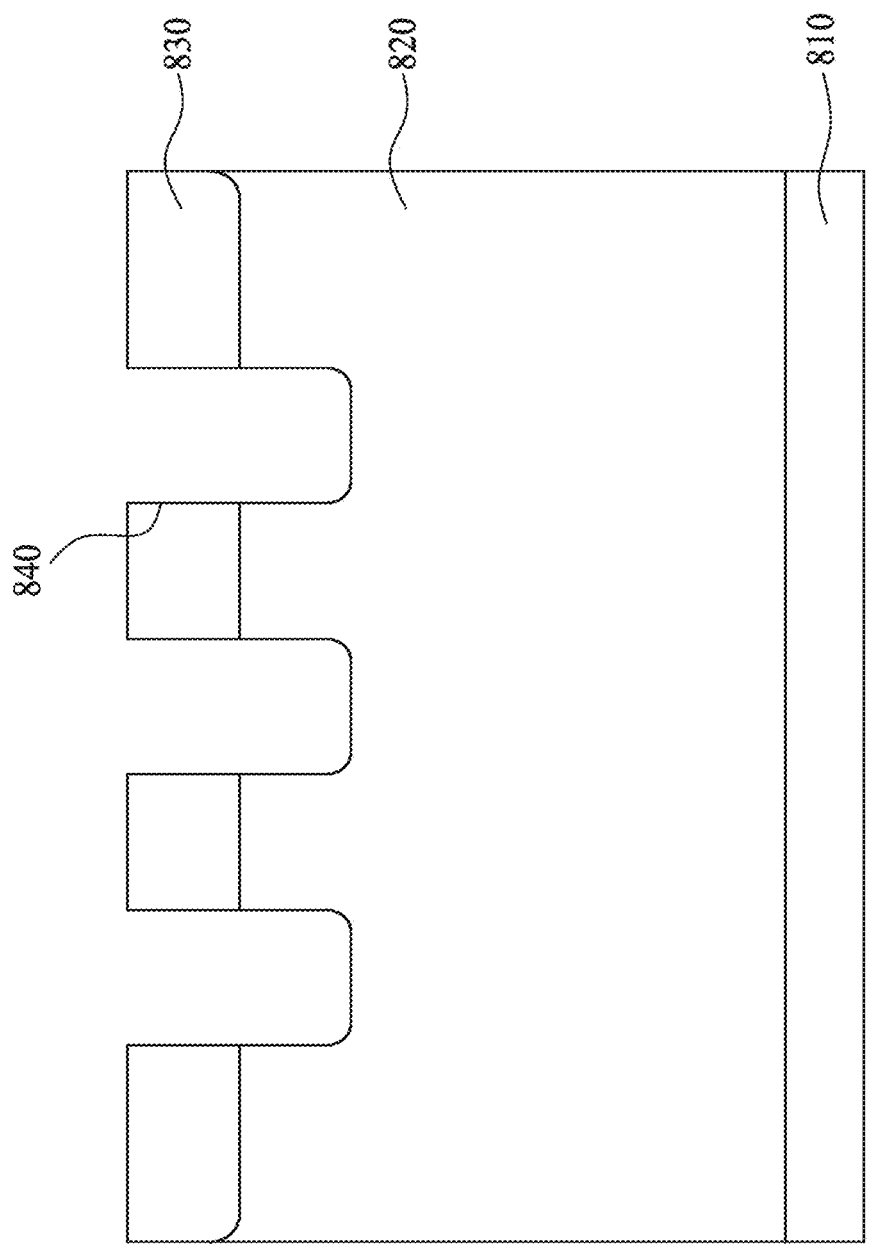

As shown in FIG. 8C, a plurality of gate trenches 840 are formed in the doped layer 830 and the epitaxial layer 820. In some embodiments of the present disclosure, a hard mask layer is formed over the doped layer 830. In some embodiments of the present disclosure, a hard mask material is formed by a chemical vapor deposition (CVD) process, a physical vapor deposition (PVD) process, spin-on coating, or another suitable formation process, and then patterned by a photolithography/etching process, a laser drilling process or another suitable material removal process to form the hard mask layer. In some embodiments of the present disclosure, the hard mask layer includes silicon dioxide, silicon nitride or another suitable masking material. In some embodiments of the present disclosure, the hard mask layer exposes a portion of the doped layer 830 for forming the gate trenches 840.

In some embodiments of the present disclosure, the exposed portion of the doped layer 830 is removed according to the hard mask layer to form the gate trenches 840 in the doped layer 830 and the epitaxial layer 820. In some embodiments of the present disclosure, a part of the doped layer 830 and a part of the epitaxial layer 820 are removed by a dry etching process. In some embodiments of the present disclosure, the etchant includes carbon fluorides (CxFy), sulfur hexafluoride ($SF_6$), oxygen gas ($O_2$), helium (He), carbon chlorides (CxCly), argon (Ar), another suitable etchant material or a combination thereof. In some embodiments of the present disclosure, the gate trenches 840 are a straight walled trench or an angled trench. In the embodiment of FIG. 8C, the gate trenches 840 are straight walled trenches.

Figure 8D:
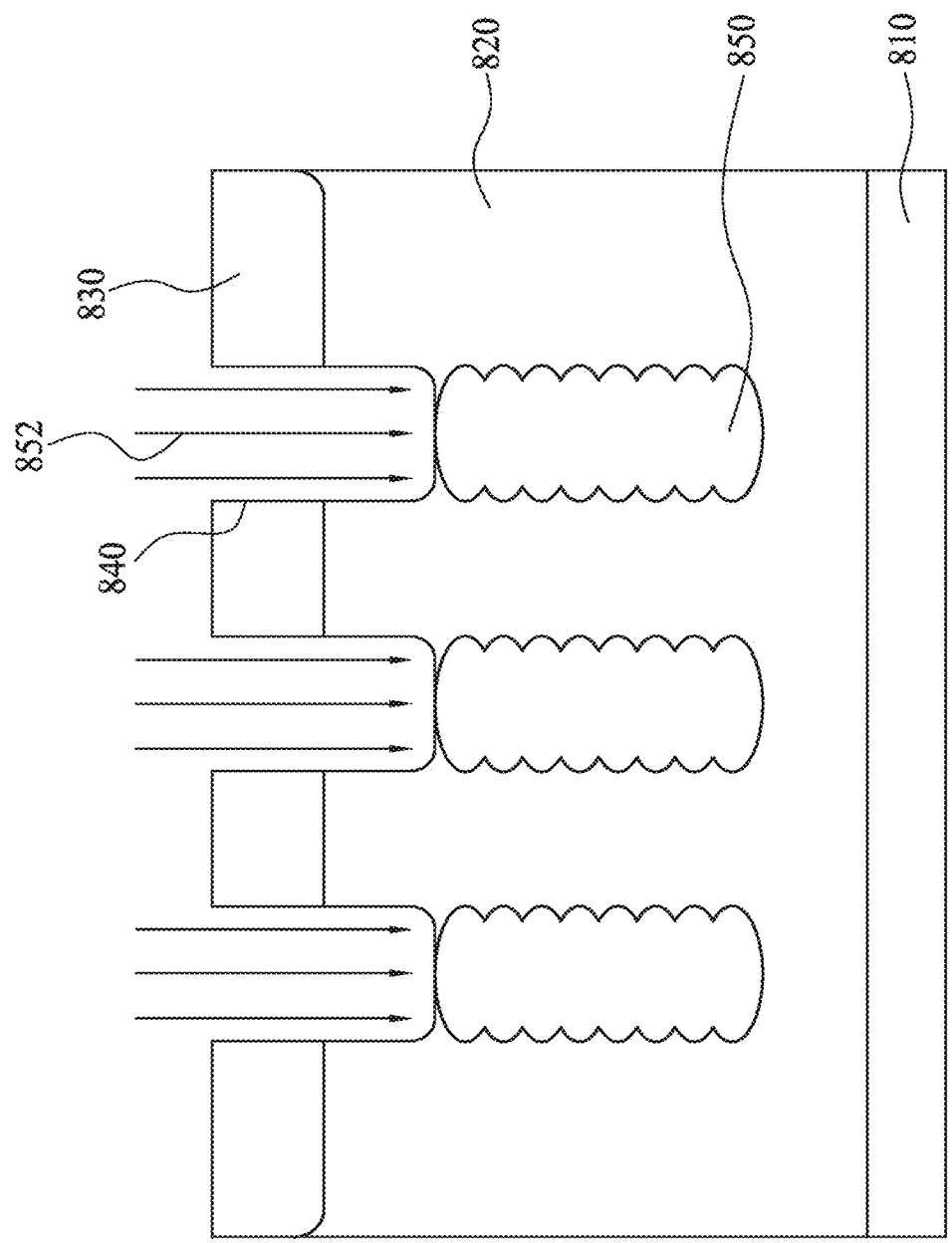

Referring to FIG. 8D, ion implantation is performed to deposit dopants 852 of a second conductivity type into the gate trenches 840, so as to form a plurality of pillars 850 in the epitaxial layer 820 and individually correspond to and under the gate trenches 840. In some embodiments of the present disclosure, a vertical ion implantation process is performed into the gate trenches 840. In some embodiments of the present disclosure, the pillars 850 are a second conductivity type. In some embodiments of the present disclosure, the ion implantation deposits p-type dopants into the gate trenches 840, so as to form a p-doped pillar 850. In some embodiments of the present disclosure, the p-type dopants include, but not limited to, boron, boron difluoride, another suitable p-type dopant, or a combination thereof.

In some embodiments of the present disclosure, the formation of the pillars 850 includes forming a trench filled with the second conductivity type material or forming a multilayer structure. In some embodiments of the present disclosure, the formation of the trench includes forming an angled trench, and then a second conductivity type material is filled in the trench by an epitaxial method. In some embodiments of the present disclosure, a pattern of the trench is formed the same as that of the gate trenches 840.

In some embodiments of FIG. 8D, each of the pillars 850 is formed a multilayer structure. In some embodiments of the present disclosure, the formation of the multilayer structure includes forming a multilayer of the second conductivity type by performing an ion implantation. In some embodiments of the present disclosure, each of the pillars 850 is formed a p-doped multilayer structure. In some embodiments of the present disclosure, the multilayer structure of the pillars 850 is fabricated by multi-epi and doping processes with masks.

After the dopants 852 are deposited, the hard mask layer is removed. In some embodiments of the present disclosure, the hard mask layer is removed by an etching process, a planarization process, another suitable material removal process or a combination thereof.

Figure 8E:
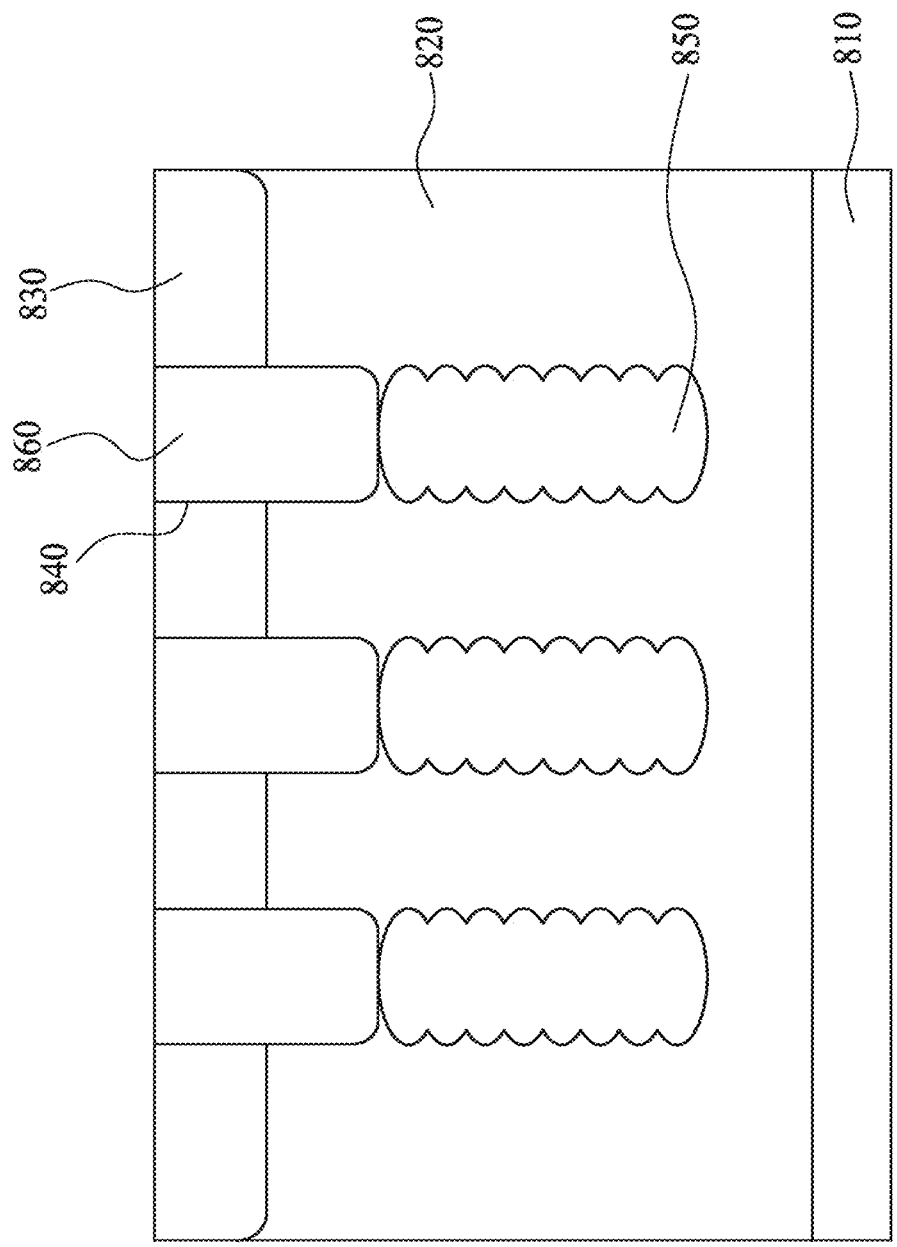

As shown in FIG. 8E, an insulating layer 860 is filled in the gate trenches 840. In some embodiments of the present disclosure, the insulating layer 860 is omitted. In some embodiments of the present disclosure, the insulating layer 860 is formed after formation of another insulating layer. In some embodiments, the insulating layer 860 includes silicon dioxide, aerogel, another suitable insulating material or a combination thereof. In some embodiments of the present disclosure, the insulating layer 860 is blanket deposited by a CVD process, a PVD process, an atomic layer deposition (ALD) process, a spin-on process or another suitable formation process. In some embodiments of the present disclosure, the insulating layer 860 includes a conductive material such as polysilicon or another suitable conductive material. In some embodiments of the present disclosure, the insulating layer 860 includes a dielectric material, such as silicon dioxide, a silicon nitride or another suitable dielectric material. In some embodiments of the present disclosure, the insulating layer 860 includes an air gap. In some embodiments of the present disclosure, the formation of the insulating layer further includes forming an oxide layer on an inner surface of the gate trenches; and filling a polymer material in the gate trenches.

In some embodiments of the present disclosure, a planarization process is performed. In some embodiments of the present disclosure, the planarization process includes a chemical mechanical polishing (CMP) process, a grinding process, an etching process, another suitable material removal process or a combination thereof. In some embodiments of the present disclosure, the planarization process removes portions of the insulating layer 860 outside the gate trenches 840. In some embodiments of the present disclosure, after the planarization process, a top surface of the insulating layer 860 and a top surface of the doped wells are coplanar.

Figure 9:
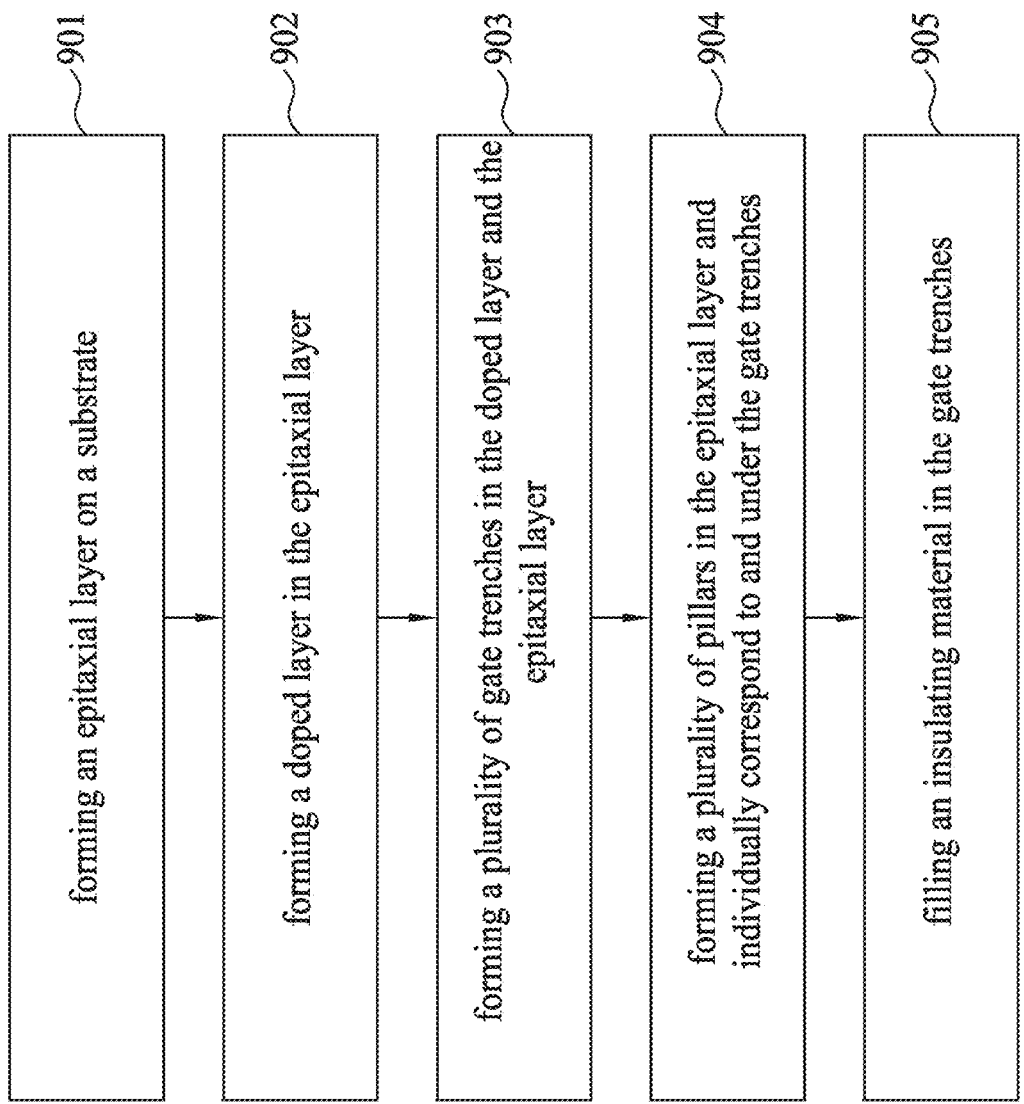
FIG. 9 is a flow chart illustrating a method for manufacturing a semiconductor device having a super junction structure, in accordance with some embodiments.

FIG. 9 is a flow chart illustrating a method for manufacturing a semiconductor device having a super junction structure, in accordance with some embodiments. The operations 901 to 905 are disclosed in association with the cross-sectional views of the integrated circuit structure 800 from FIGS. 8A to 8E at various fabrication stages.

In the operation 901, the substrate 810 is provided, and the epitaxial layer 820 of a first conductivity type is then formed on the substrate 810. The epitaxial layer 820 is formed on the substrate 810 by an epitaxial process. In some embodiments of the present disclosure, the epitaxial layer 820 is a first conductivity type. In some embodiments of the present disclosure, the epitaxial layer 820 is formed an n-type epitaxial layer. In some embodiments of the present disclosure, a bury layer of the first conductivity type is formed between the substrate 810 and the epitaxial layer 820. In some embodiments of the present disclosure, the bury layer is formed an n-doped bury layer.

In the operation 902, ion implantation is performed to deposit dopants of the second conductivity type into the epitaxial layer 820, so as to form the doped layer 830 of the second conductivity type in the epitaxial layer 820. In some embodiments of the present disclosure, the doped layer 830 is a second conductivity type opposite to the first conductivity type. In some embodiments of the present disclosure, the ion implantation deposits p-type dopants into the epitaxial layer 820.

In the operation 903, the gate trenches 840 are formed in the doped layer 830 and the epitaxial layer 820. In some embodiments of the present disclosure, a hard mask layer is formed over the doped layer 830. In some embodiments of the present disclosure, the hard mask layer exposes a portion of the doped layer 830 for forming the gate trenches 840. In some embodiments of the present disclosure, the exposed portion of the doped layer 830 is removed according to the hard mask layer to form the gate trenches 840 in the doped layer 830 and the epitaxial layer 820. In some embodiments of the present disclosure, a part of the doped layer 830 and a part of the epitaxial layer 820 are removed by a dry etching process. In the embodiment of FIG. 8C, the gate trenches 840 are straight walled trenches.

In the operation 904, ion implantation is performed to deposit dopants 852 of the second conductivity type into the gate trenches 840, so as to form the pillars 850 in the epitaxial layer 820 and individually correspond to and under the gate trenches 840. In some embodiments of FIG. 8D, a vertical ion implantation process is performed into the gate trenches 840. In some embodiments of the present disclosure, the pillars 850 are a second conductivity type. In some embodiments of the present disclosure, the ion implantation deposits p-type dopants into the gate trenches 840, so as to form a p-doped pillar 850.

In some embodiments of the present disclosure, the formation of the pillars 850 includes forming a trench filled with the second conductivity type material or forming a multilayer structure. In some embodiments of the present disclosure, the formation of the trench includes forming an angled trench, and then a second conductivity type material is filled in the trench by an epitaxial method. In some embodiments of the present disclosure, a pattern of the trench is formed the same as that of the gate trenches 840.

In some embodiments of FIG. 8D, each of the pillars 850 is formed a multilayer structure. In some embodiments of the present disclosure, the formation of the multilayer structure includes forming a multilayer of the second conductivity type by performing an ion implantation. In some embodiments of the present disclosure, each of the pillars 850 is formed a p-doped multilayer structure. In some embodiments of the present disclosure, the multilayer structure of the pillars 850 is fabricated by multi-epi and doping processes with masks. In some embodiments of the present disclosure, after the dopants 852 are deposited, the hard mask layer is removed.

In the operation 905, an insulating layer 860 is filled in the gate trenches 840. In some embodiments of the present disclosure, the insulating layer 860 is blanket deposited by a CVD process, a PVD process, an atomic layer deposition (ALD) process, a spin-on process or another suitable formation process. In some embodiments of the present disclosure, the formation of the insulating layer further includes forming an oxide layer on an inner surface of the gate trenches; and filling a polymer material in the gate trenches.

In some embodiments of the present disclosure, a planarization process is performed. In some embodiments of the present disclosure, the planarization process includes a chemical mechanical polishing (CMP) process, a grinding process, an etching process, another suitable material removal process or a combination thereof. In some embodiments of the present disclosure, the planarization process removes portions of the insulating layer 860 outside the gate trenches 840. In some embodiments of the present disclosure, after the planarization process, a top surface of the insulating layer 860 and a top surface of the doped wells are coplanar.

FIG. 10 is a cross-sectional view of a semiconductor device 1000 having a super junction structure, in accordance with some embodiments. In FIG. 10, the semiconductor device 1000 having a super junction structure includes a substrate 1010, an epitaxial layer 1020, a plurality of pillars 1030, a plurality of gate trenches 1040, an insulating layer 1050, a plurality of doped wells 1060, a bury layer 1070 and a doped column 1080.

In FIG. 10, the semiconductor device 1000 having a super junction structure further includes a cell region 1001 and a terminal region 1002 adjacent to the cell region 1001. In some embodiments of FIG. 10, the pillars 1030, the gate trenches 1040, the insulating layer 1050 and the doped wells 1060 are positioned in the cell region 1001; and the doped column 1080 is positioned in the terminal region 1002.

In some embodiments of the present disclosure, the substrate 1010 is a doped substrate of the second conductivity type. In some embodiments of the present disclosure, the substrate 1010 is a p-doped substrate. In some embodiments of the present disclosure, the substrate 1010 includes p-type dopants and thus can be acted as a p-type base. In some embodiments of the present disclosure, the p-type dopants in the substrate 1010 include boron, boron difluoride, another suitable p-type dopant or a combination thereof. The epitaxial layer 1020 of a first conductivity type is on the substrate 1010. In some embodiments of the present disclosure, the epitaxial layer 1020 is an n-epi layer.

The bury layer 1070 of the first conductivity type is between the substrate 1010 and epitaxial layer 1020. In some embodiments of the present disclosure, the bury layer 1070 is an n-doped bury layer. In some embodiments of the present disclosure, the bury layer 1070 includes silicon, germanium, another suitable n-type semiconductor material or the combination thereof.

The pillars 1030 of a second conductivity type are in the epitaxial layer 1020. In some embodiments of the present disclosure, the second conductivity type is opposite to the first conductivity type. In some embodiments of the present disclosure, the pillars 1030 are p-doped pillars. In some embodiments of the present disclosure, the pillars 1030 include p-type dopants and thus can be acted as a p-type column. In some embodiments of the present disclosure, each of the pillars 1030 is a multilayer structure. In some embodiments of the present disclosure, the multilayer structure is a multilayer of the second conductivity type. In some embodiments of the present disclosure, each of the pillars 1030 is a p-doped multilayer structure.

The gate trenches 1040 are individually correspond to and over the pillars 1030, and the insulating layer 1050 is in the gate trenches 340. In some embodiments of the present disclosure, the pillars 1030 are individually in contact with the insulating layer 1050 in the gate trenches 1040.

In some embodiments of FIG. 10, the insulating layer 1050 includes an oxide layer 1054 disposed on an inner surface of the gate trenches 1040; and a polymer material 1052 disposed on the oxide layer 1054 and in the gate trenches 1040. In some embodiments of the present disclosure, the insulating layer 1050 can be acted as a gate insulating layer and in contact with a gate electrode 1051. In some embodiments of the present disclosure, the semiconductor device 1000 further includes another insulating layer between the insulating layer 1050 and an inner surface of the gate trenches 1040.

The doped wells 1060 are in the epitaxial layer 1020. In some embodiments of the present disclosure, each of the doped wells 1060 is between two adjacent gate trenches 1040. In some embodiments of FIG. 10, each of the doped wells 1060 includes a p-doped well 1062, a heavily p-doped well 1068 and two heavily n-doped wells 1064 and 1066. In some embodiments of the present disclosure, the heavily n-doped wells 1064 and 1066 are disposed on the p-doped well 1062, and are not in contact with each other. In some embodiments of the present disclosure, the heavily p-doped well 1068 is disposed on the p-doped well 1062 and sandwiched between the heavily n-doped wells 1064 and 1066. In some embodiments of the present disclosure, a source electrode 1061 is sandwiched between the heavily n-doped wells 1064 and 1066 and in contact with the heavily p-doped well 1068.

The doped column 1080 is in the epitaxial layer 1020 and in contact with the bury layer 1070. In some embodiments of the present disclosure, the doped column 1080 is the first conductivity type. In some embodiments of the present disclosure, the doped column 1080 is an n-doped bury layer. In some embodiments of the present disclosure, the doped column 1080 includes silicon, germanium, another suitable n-type semiconductor material or the combination thereof. In some embodiments of the present disclosure, the bury layer 1070 and the doped column 1080 are formed to act as an interlayer to conduct from the top source electrode 1061 to a top drain 1081. In some embodiments of the present disclosure, the top drain 1081 is in contact with a top surface of the doped column 1080. In some embodiments of the present disclosure, a heavily n-doped well 1082 is further sandwiched between the top drain 1081 and the doped column 1080.

FIGS. 11A-11G are cross-sectional views at various stages of fabricating a super junction structure 1100, in accordance with some embodiments.

Figure 11A:
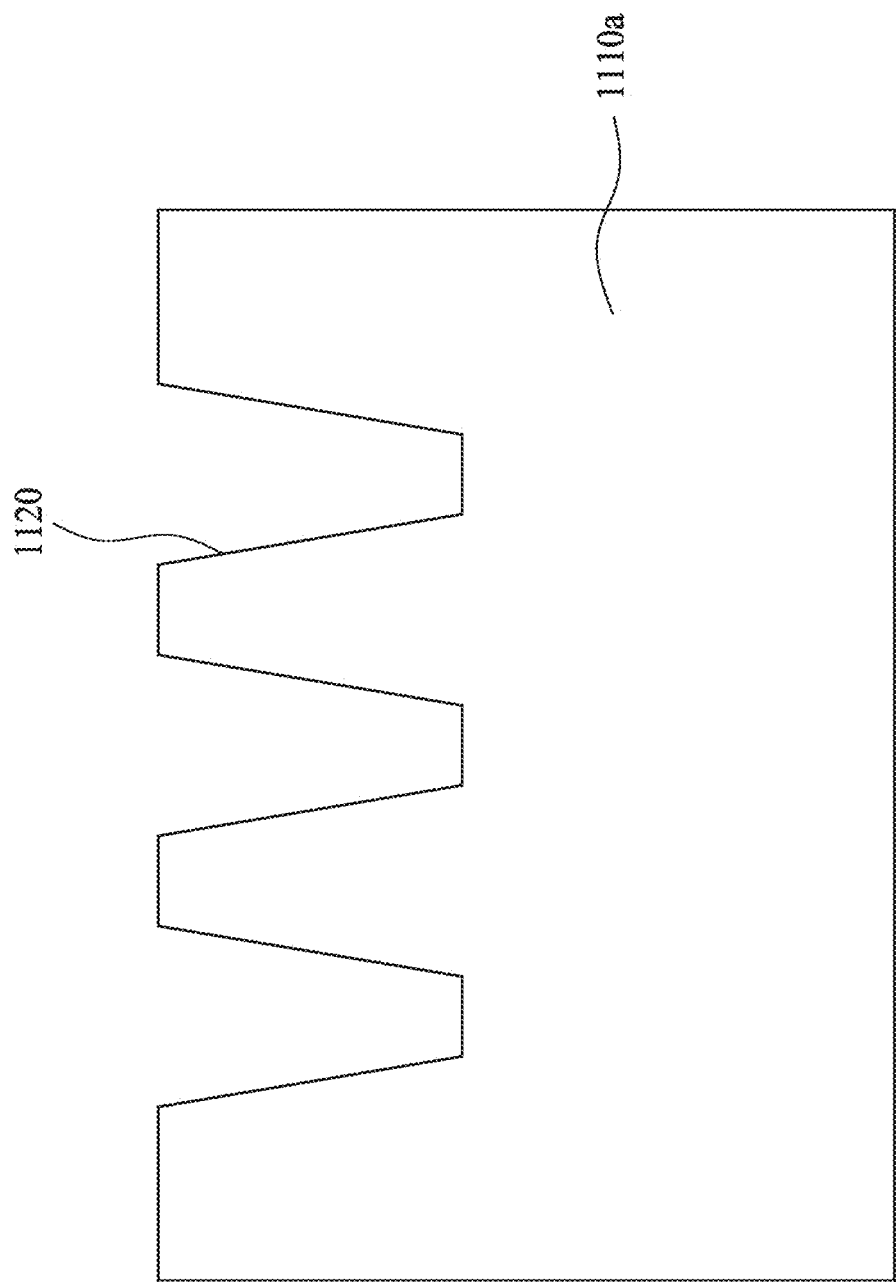
FIGS. 11A-11G are cross-sectional views at various stages of fabricating a super junction structure, in accordance with some embodiments.

As shown in FIG. 11A, a plurality of trenches 1120 are formed in a substrate 1110*a* of a first conductivity type. In some embodiments of the present disclosure, the substrate 1110*a* is an n-doped substrate. In some embodiments of the present disclosure, the n-type dopant includes, but not limited to, arsenic, phosphorous, another suitable n-type dopant or a combination thereof. In some embodiments of the present disclosure, the substrate 1110a is a heavily doped substrate. In some embodiments of the present disclosure, the substrate 1110a is acted as a drain electrode. In some embodiments of the present disclosure, the substrate 1110a includes, but not limited to, an elementary semiconductor including silicon or germanium in crystal, polycrystalline or an amorphous structure; a compound semiconductor including silicon carbide, gallium arsenide, gallium phosphide, indium phosphide, indium arsenide, indium antimonide or a combination thereof; an alloy semiconductor including SiGe, GaAsP, AlInAs, AlGaAs, GaInAs, GaInP, GaInAsP or a combination thereof; any other suitable material or combinations thereof.

In some embodiments of the present disclosure, a hard mask layer is formed over the substrate 1110a. In some embodiments of the present disclosure, a hard mask material is formed by a chemical vapor deposition (CVD) process, a physical vapor deposition (PVD) process, spin-on coating, or another suitable formation process, and then patterned by a photolithography/etching process, a laser drilling process or another suitable material removal process to form the hard mask layer. In some embodiments of the present disclosure, the hard mask layer includes silicon dioxide, silicon nitride or another suitable masking material. In some embodiments of the present disclosure, the hard mask layer exposes a portion of the substrate 1110a for forming the trenches 1120.

In some embodiments of the present disclosure, the exposed portion of the substrate 1110a is removed according to the hard mask layer to form the trenches 1120 in the substrate 1110a. In some embodiments of the present disclosure, a part of the substrate 1110a is removed by a dry etching process. In some embodiments of the present disclosure, the etchant includes carbon fluorides (CxFy), sulfur hexafluoride ($SF_6$), oxygen gas ($O_2$), helium (He), carbon chlorides (CxCly), argon (Ar), another suitable etchant material or a combination thereof. In some embodiments of FIG. 11A, the trenches 1120 are formed angled trenches.

Figure 11B:
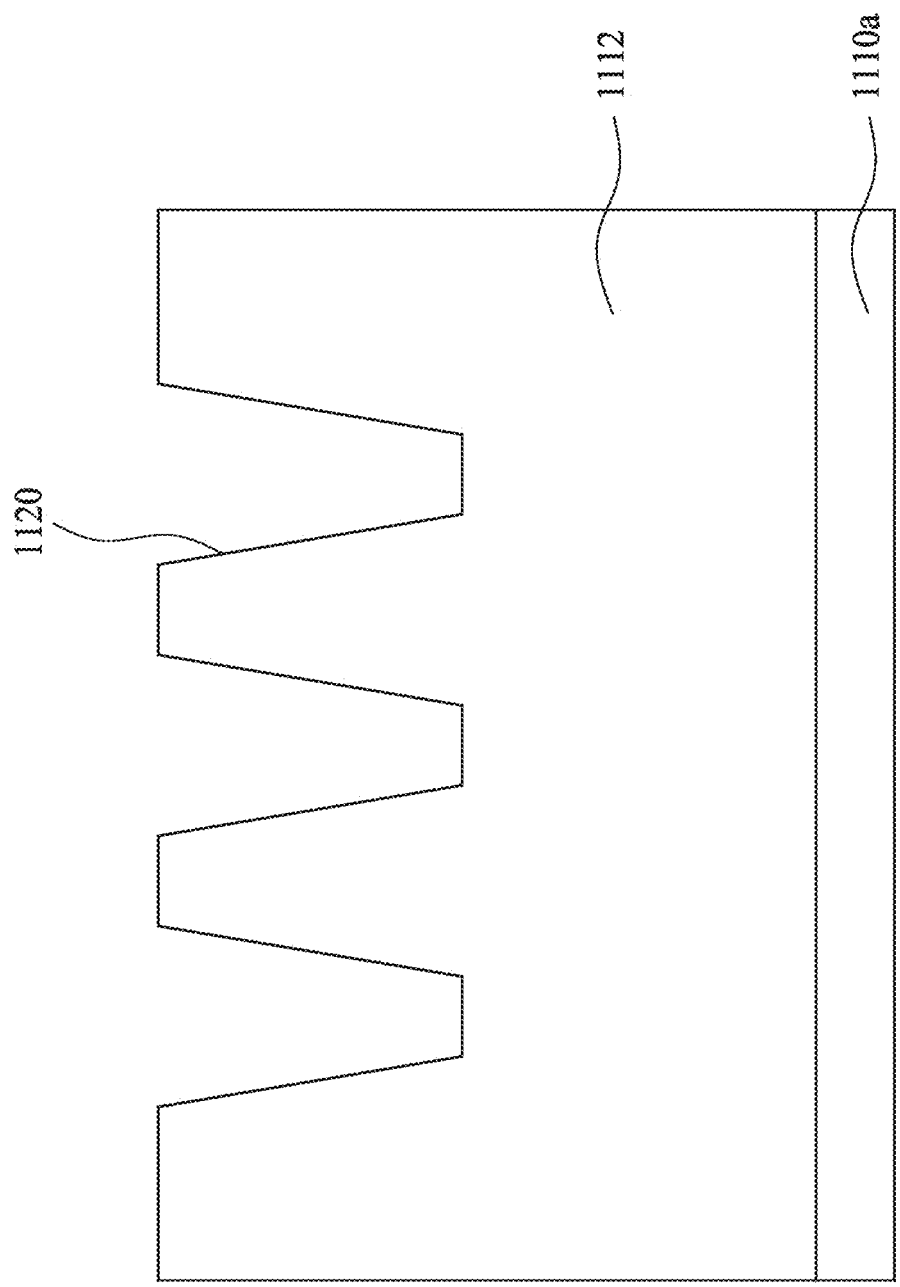

As shown in FIG. 11B, the trenches 1120 are formed in an epitaxial layer 1112 of the first conductivity type, wherein the epitaxial layer 1112 is deposited on the substrate 1110a. In some embodiments of the present disclosure, the epitaxial layer 1112 is an n-doped epitaxial (n-epi) layer. In some embodiments of the present disclosure, the epitaxial layer 1112 includes silicon, germanium, another suitable n-type semiconductor material or the combination thereof.

In some embodiments of the present disclosure, a hard mask layer is formed over the epitaxial layer 1112. In some embodiments of the present disclosure, a hard mask material is formed by a chemical vapor deposition (CVD) process, a physical vapor deposition (PVD) process, spin-on coating, or another suitable formation process, and then patterned by a photolithography/etching process, a laser drilling process or another suitable material removal process to form the hard mask layer. In some embodiments of the present disclosure, the hard mask layer includes silicon dioxide, silicon nitride or another suitable masking material. In some embodiments of the present disclosure, the hard mask layer exposes a portion of the epitaxial layer 1112 for forming the trenches 1120.

In some embodiments of the present disclosure, the exposed portion of the epitaxial layer 1112 is removed according to the hard mask layer to form the trenches 1120 in the epitaxial layer 1112. In some embodiments of the present disclosure, a part of the substrate 1110a is removed by a dry etching process. In some embodiments of the present disclosure, the etchant includes carbon fluorides (CxFy), sulfur hexafluoride ($SF_6$), oxygen gas ($O_2$), helium (He), carbon chlorides (CxCly), argon (Ar), another suitable etchant material or a combination thereof. In some embodiments of FIG. 11B, the trenches 1120 are formed angled trenches.

Figure 11C:
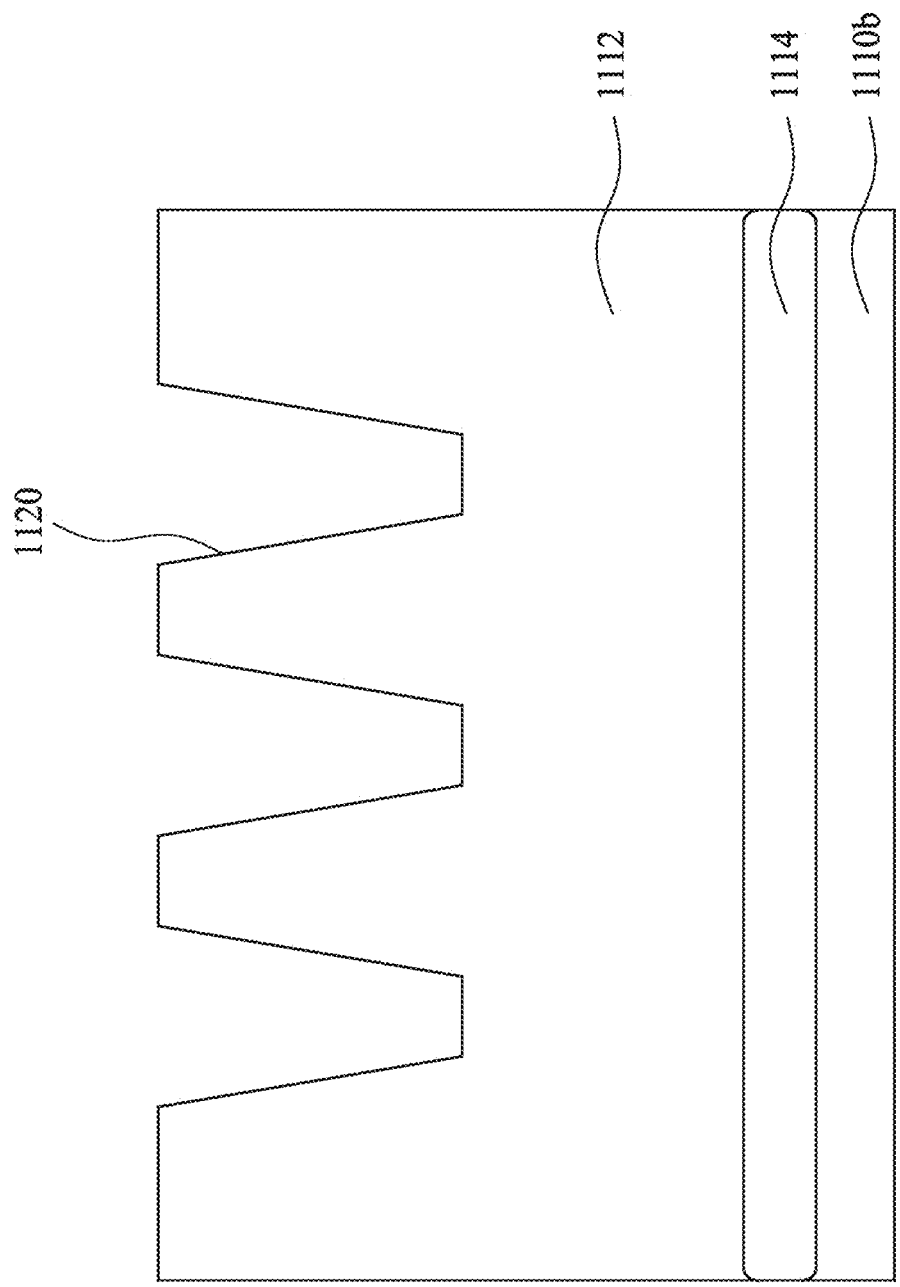

As shown in FIG. 11C, the trenches 1120 are formed in an epitaxial layer 1112 of the first conductivity type, wherein the epitaxial layer 1112 is deposited on the substrate 1110b. In some embodiments of the present disclosure, the substrate 1110b is a second conductivity type opposite to the first conductivity type. In some embodiments of the present disclosure, the substrate 1110b is a doped substrate of the second conductivity type. In some embodiments of the present disclosure, the substrate 1110b is a p-doped substrate. In some embodiments of the present disclosure, the substrate 1110b includes p-type dopants and thus can be acted as a p-type base. In some embodiments of the present disclosure, the p-type dopants in the substrate 1110b include boron, boron difluoride, another suitable p-type dopant or a combination thereof. The epitaxial layer 1112 of a first conductivity type is on the substrate 1110b. In some embodiments of the present disclosure, the epitaxial layer 1112 is an n-epi layer.

In some embodiments of FIG. 11C, a bury layer 1114 of the first conductivity type is sandwiched between the epitaxial layer 1112 and the substrate 1110b. In some embodiments of the present disclosure, the bury layer 1114 is an n-doped bury layer. In some embodiments of the present disclosure, the bury layer 1114 includes silicon, germanium, another suitable n-type semiconductor material or the combination thereof. In some embodiments of the present disclosure, the bury layer 1114 is acted as an interlayer to conduct from a top source electrode to a top drain.

Figure 11D:
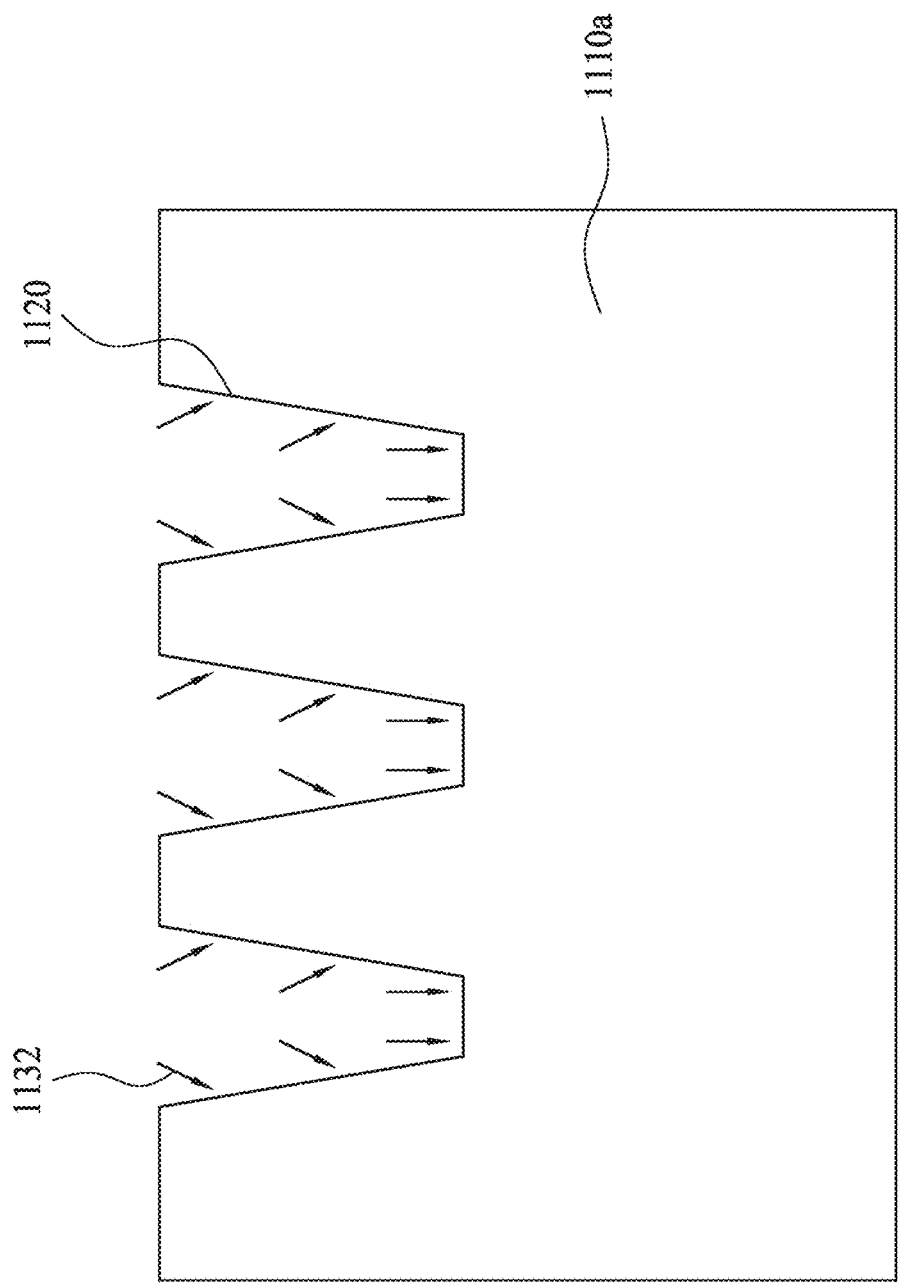
Figure 11E:
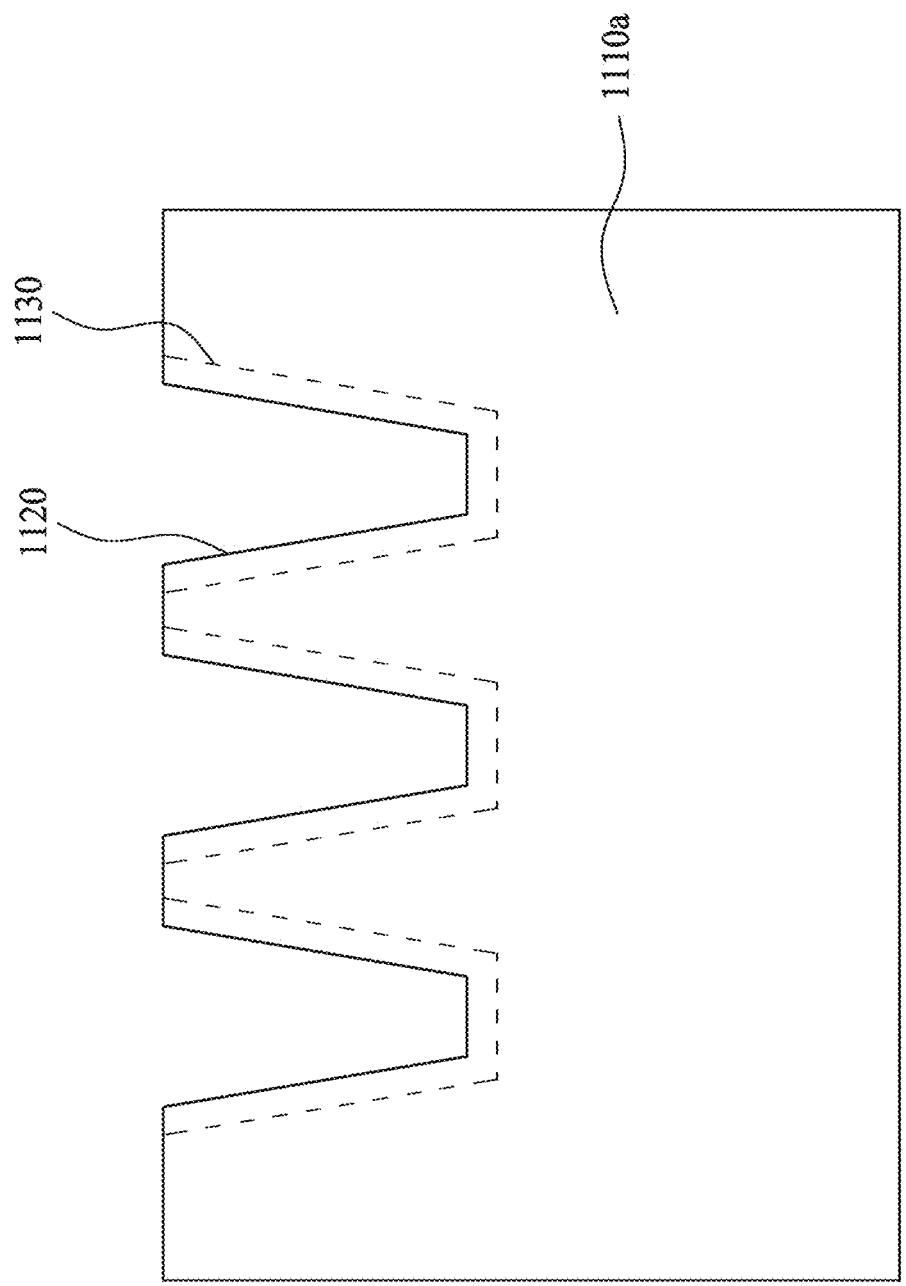

Referring to FIGS. 11D and 11E, ion implantation is performed to deposit dopants 1132 of the second conductivity type into the trenches 1120, so as to form a doped region 1130 of the second conductivity type in the substrate 1110a and surrounding the trenches 1120. In some embodiments of the present disclosure, a tilt and vertical ion implantation process is performed into the trenches 1120. In some embodiments of the present disclosure, the ion implantation deposits p-type dopants 1132 into the trenches 1120, so as to form a p-doped region 1130 in the substrate 1110a and surrounding the trenches 1120. In some embodiments of the present disclosure, the p-type dopants 1132 include, but not limited to, boron, boron difluoride, another suitable p-type dopant, or a combination thereof.

Figure 11F:
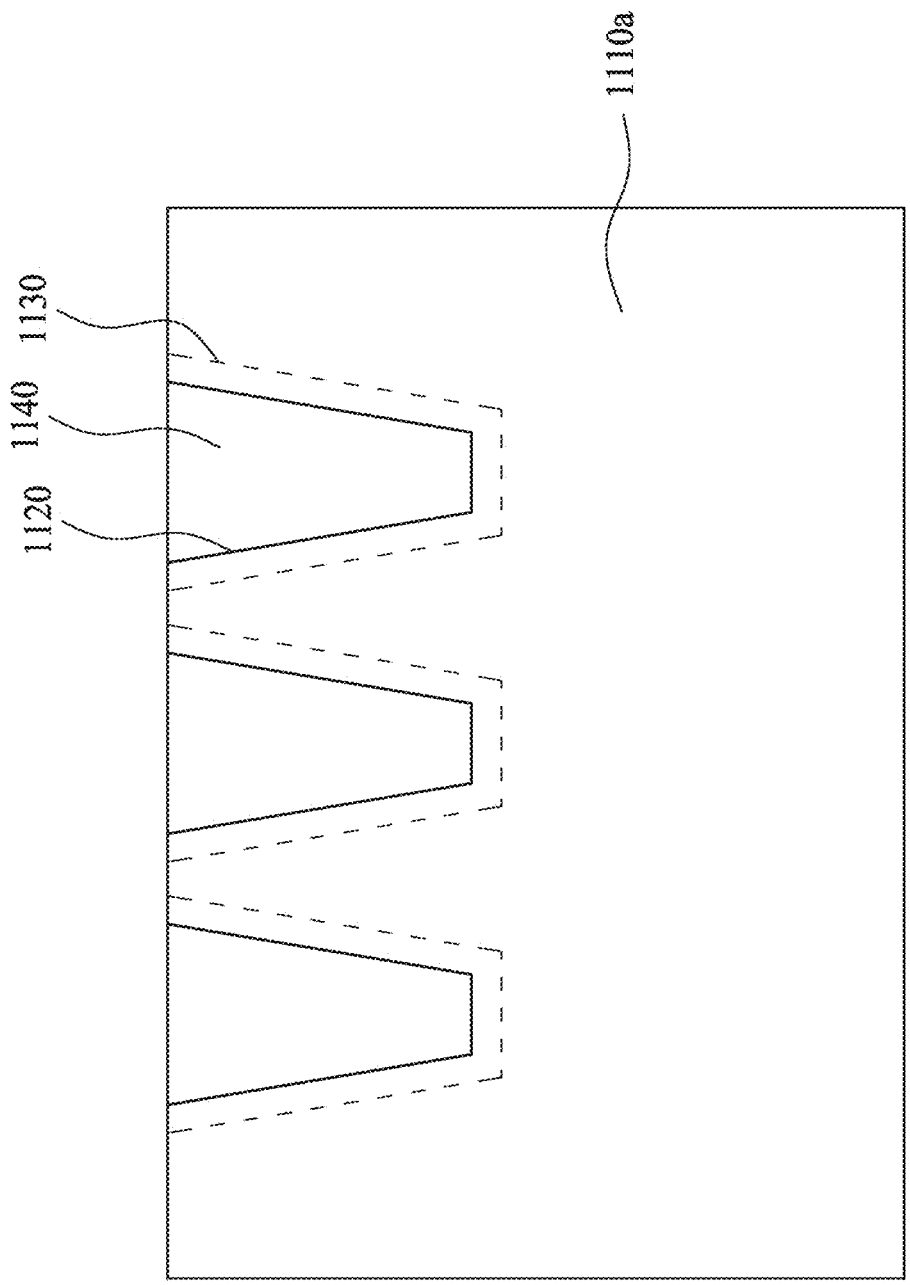

Referring to FIG. 11F, an undoped material 1140 is filled in the trenches 1120. In some embodiments, filling the undoped material 1140 in the trenches 1120 includes depositing an undoped polymer material in the trenches 1120. In some embodiments, the undoped material 1140 includes a conductive material such as polysilicon, another suitable conductive material or a combination thereof. In some embodiments of the present disclosure, the undoped material 1140 is blanket deposited by a CVD process, a PVD process, an atomic layer deposition (ALD) process, a spin-on process or another suitable formation process.

In some embodiments of the present disclosure, a planarization process is performed. In some embodiments of the present disclosure, the planarization process removes portions of the undoped material 1140 outside the trenches 1120. In some embodiments of the present disclosure, after the planarization process, a top surface of the undoped material 1140 and a top surface of the substrate 1110a are coplanar. In some embodiments of the present disclosure, the planarization process includes a chemical mechanical polishing (CMP) process, a grinding process, an etching process, another suitable material removal process or a combination thereof.

Figure 11G:
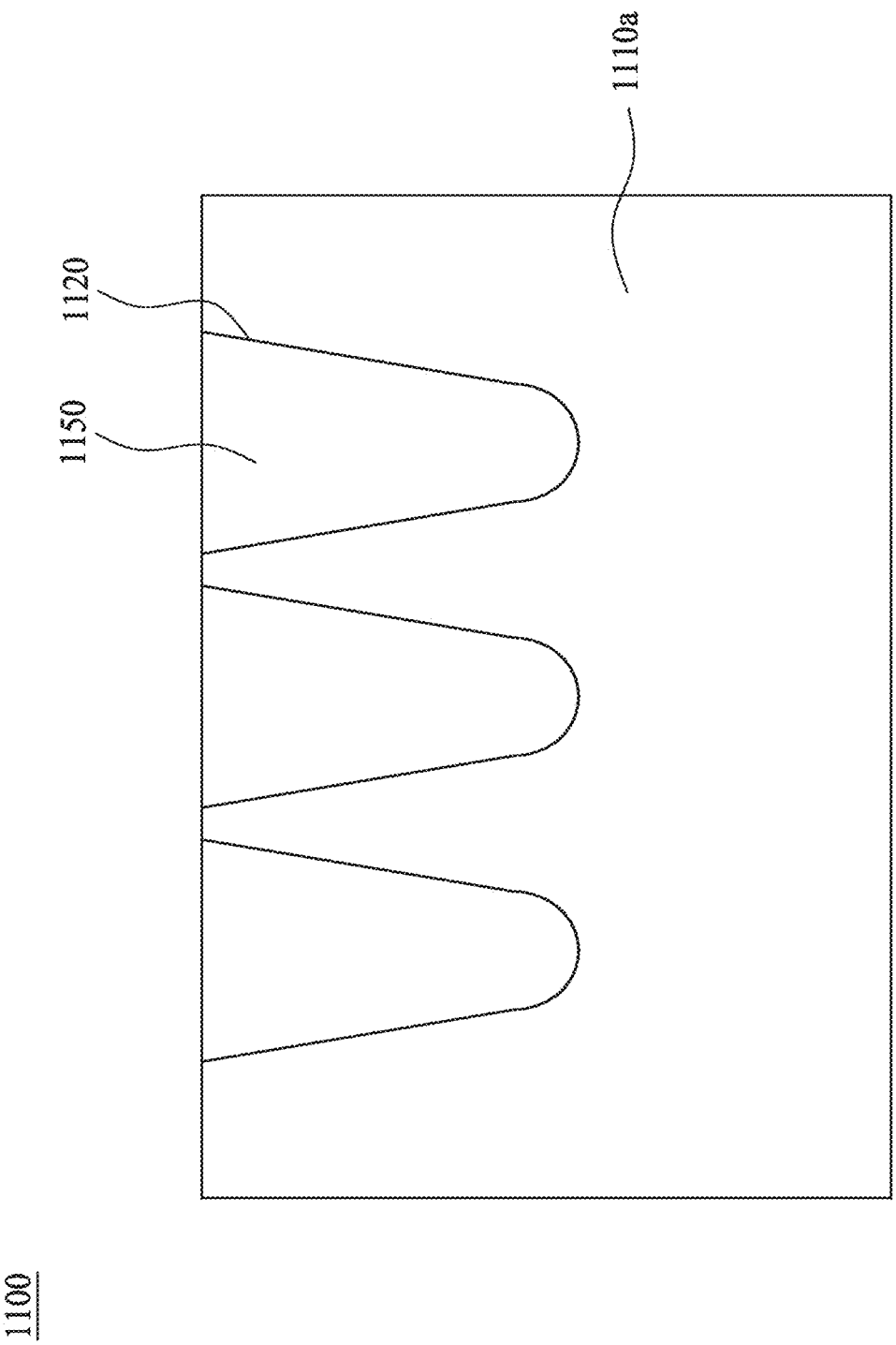

Referring to FIG. 11G, a pillar 1150 of the second conductivity type is formed from the undoped material 1140 in the trenches 1120. In some embodiments of the present disclosure, the formation of the pillar 1150 includes performing a thermal diffusion process to diffuse the doped region 1130 of the second conductivity type surrounding the trenches 1120 into the undoped material 1140 in the trenches 1120, so as to form the pillar 1150 of the second conductivity type. In some embodiments of the present disclosure, the thermal process diffuses the p-type dopants 1132 from the doped region 1130 into the undoped material 1140 in the trenches 1120, so as to form the p-doped pillar 1150 in the substrate 1110a. In some embodiments of the present disclosure, the pillar 1150 of the second conductivity type is formed under a gate trench or a doped well of a second conductivity type.

Figure 12:
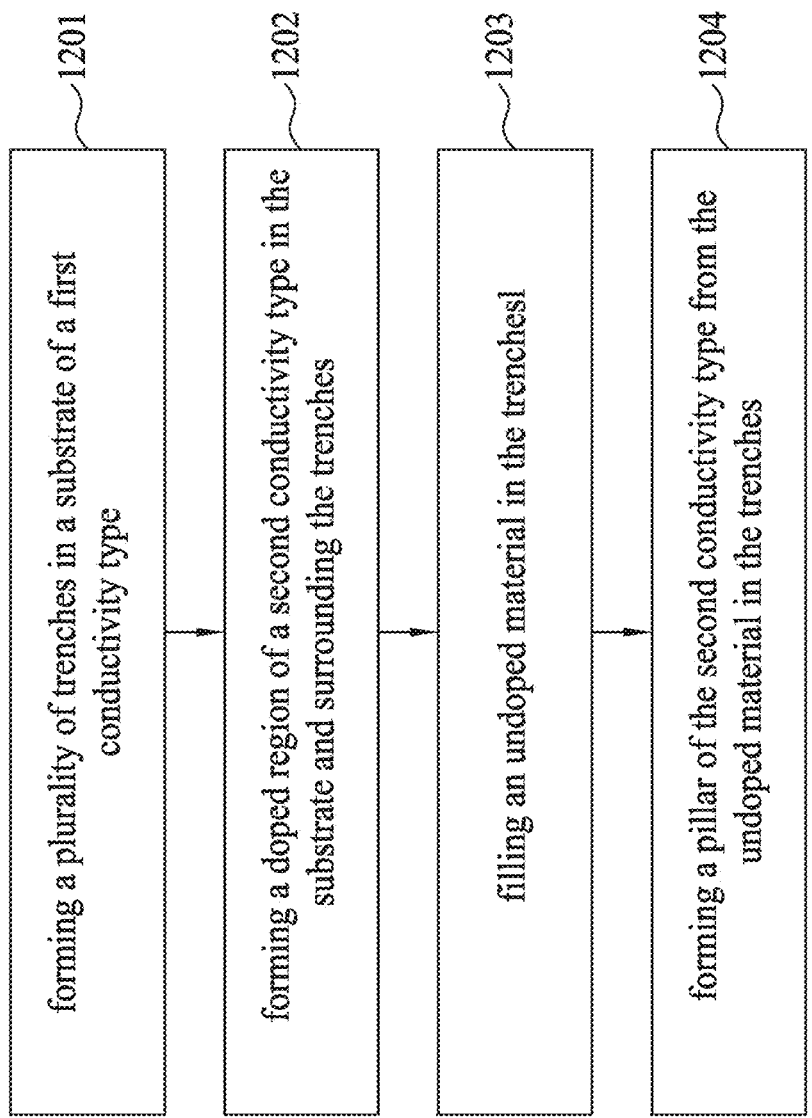
FIG. 12 is a flow chart illustrating a method for manufacturing a super junction structure, in accordance with some embodiments.

FIG. 12 is a flow chart illustrating a method for manufacturing a super junction structure, in accordance with some embodiments. The operations 1201 to 1204 are disclosed in association with the cross-sectional views of the integrated circuit structure 1100 from FIGS. 11A, 11D to 11G at various fabrication stages.

In the operation 1201, the trenches 1120 are formed in the substrate 1110a of the first conductivity type. In some embodiments of the present disclosure, the substrate 1110a is an n-doped substrate. In some embodiments of the present disclosure, a hard mask layer is formed over the substrate 1110a. In some embodiments of the present disclosure, the hard mask layer exposes a portion of the substrate 1110a for forming the trenches 1120. In some embodiments of the present disclosure, the exposed portion of the substrate 1110a is removed according to the hard mask layer to form the trenches 1120 in the substrate 1110a. In some embodiments of the present disclosure, a part of the substrate 1110a is removed by a dry etching process. Referring to FIG. 11A, the trenches 1120 are formed angled trenches.

In the operation 1202, the doped region 1130 of the second conductivity type is formed in the substrate 1110a and surrounding the trenches 1120. Referring to FIG. 11D, ion implantation is performed to deposit dopants 1132 of the second conductivity type into the trenches 1120. Referring to FIG. 11 E, the doped region 1130 is formed in the substrate 1110a and surrounding the trenches 1120. In some embodiments of the present disclosure, a tilt and vertical ion implantation process is performed into the trenches 1120. In some embodiments of the present disclosure, the ion implantation deposits p-type dopants 1132 into the trenches 1120, so as to form a p-doped region 1130 in the substrate 1110a and surrounding the trenches 1120.

In the operation 1203, the undoped material 1140 is filled in the trenches 1120. In some embodiments, filling the undoped material 1140 in the trenches 1120 includes depositing an undoped polymer material in the trenches 1120. In some embodiments of the present disclosure, the undoped material 1140 is blanket deposited by a CVD process, a PVD process, an atomic layer deposition (ALD) process, a spin-on process or another suitable formation process.

In some embodiments of the present disclosure, a planarization process is performed. In some embodiments of the present disclosure, the planarization process removes portions of the undoped material 1140 outside the trenches 1120. In some embodiments of the present disclosure, after the planarization process, a top surface of the undoped material 1140 and a top surface of the substrate 1110a are coplanar.

In the operation 1204, the pillar 1150 of the second conductivity type is formed from the undoped material 1140 in the trenches 1120. In some embodiments of the present disclosure, the formation of the pillar 1150 includes performing a thermal diffusion process to diffuse the doped region 1130 of the second conductivity type surrounding the trenches 1120 into the undoped material 1140 in the trenches 1120, so as to form the pillar 1150 of the second conductivity type. In some embodiments of the present disclosure, the thermal process diffuses the p-type dopants 1132 from the doped region 1130 into the undoped material 1140 in the trenches 1120, so as to form the p-doped pillar 1150 in the substrate 1110a. In some embodiments of the present disclosure, the pillar 1150 of the second conductivity type is formed under a gate trench or a doped well of a second conductivity type.

According to some embodiments of the present disclosure, a semiconductor device having a super junction structure includes a substrate, an epitaxial layer of a first conductivity type, a plurality of pillars of a second conductivity type, a plurality of gate trenches, an insulating layer and a plurality of doped wells of the second conductivity type. The epitaxial layer of the first conductivity type is on the substrate. The pillars of the second conductivity type are in the epitaxial layer, in which the second conductivity type is opposite to the first conductivity type. The gate trenches are individually corresponding to and over the pillars. The insulating layer is in the gate trenches. The doped wells of the second conductivity type are in the epitaxial layer, in which each of the doped wells is between two adjacent gate trenches.

According to some embodiments of the present disclosure, a method for manufacturing a semiconductor device having a super junction structure includes: forming an epitaxial layer on a substrate, in which the epitaxial layer is a first conductivity type; forming a doped layer in the epitaxial layer, in which the doped layer is a second conductivity type opposite to the first conductivity type; forming a plurality of gate trenches in the doped layer and the epitaxial layer; forming a plurality of pillars in the epitaxial layer and individually correspond to and under the gate trenches; and filling an insulating material in the gate trenches.

According to some embodiments of the present disclosure, a method for manufacturing a super junction structure includes: forming a plurality of trenches in a substrate of a first conductivity type; forming a doped region of a second conductivity type in the substrate and surrounding the trenches, in which the second conductivity type is opposite to the first conductivity type; filling an undoped material in the trenches; and forming a pillar of the second conductivity type from the undoped material in the trenches.

An aspect of this description relates to a method of manufacturing a super junction structure. The method includes etching a material to define a trench, wherein the trench has a tapered profile. The method further includes implanting dopants into sidewalls and a bottom surface of the trench to define a doped region, wherein the doped region surrounds the trench. The method further includes depositing an undoped material into the trench. The method further includes performing a thermal process, wherein the thermal process drives the dopants from the doped region into the undoped material to form a conductive pillar in the trench. In some embodiments, implanting the dopants includes performing a vertical ion implantation and a tilt ion implantation. In some embodiments, depositing the undoped material includes implanting an undoped polymer. In some embodiments, depositing the undoped material includes filling the trench with the undoped material. In some embodiments, the method further includes performing a planarization process to remove the undoped material outside of the trench. In some embodiments, performing the thermal process includes forming a rounded bottom surface of the conductive pillar. In some embodiments, etching the material includes etching a substrate having a first conductivity type, and performing the thermal process includes forming the conductive pillar having a second conductivity type opposite the first conductivity type. In some embodiments, etching the material includes etching an epitaxial layer over a substrate, the epitaxial layer has a first conductivity type, and performing the thermal process includes forming the conductive pillar having a second conductivity type opposite the first conductivity type. In some embodiments, the method further includes forming the epitaxial layer over the substrate. In some embodiments, the method further includes forming a bury layer between the epitaxial layer and the substrate, wherein the bury layer has the first conductivity type, and the substrate has the second conductivity type.

An aspect of this description relates to a method of manufacturing a super junction structure. The method includes forming an epitaxial layer over a substrate, wherein the epitaxial layer has a first conductivity type. The method further includes etching the epitaxial layer to define a trench, wherein sidewalls of the trench are angled with respect to a top-most surface of the epitaxial layer, and a bottom surface of the trench is parallel to the top-most surface of the epitaxial layer. The method further includes implanting dopants into the sidewalls and the bottom surface of the trench to define a doped region, wherein a top surface of the doped region is coplanar with the top-most surface of the epitaxial layer, and the dopants are a second conductivity type opposite the first conductivity type. The method further includes filling the trench with an undoped material. The method further includes driving the dopants from the doped region into the undoped material to form a conductive pillar filling the trench. In some embodiments, driving the dopants from the doped region into the undoped material includes performing a thermal process. In some embodiments, performing the thermal process includes forming a rounded bottom surface of the conductive pillar. In some embodiments, the method further includes forming a bury layer between the substrate and the epitaxial layer, wherein the bury layer has the first conductivity type. In some embodiments, the method further includes electrically connecting the bury layer to a top source/drain electrode. In some embodiments, implanting the dopants includes performing a vertical ion implantation; and performing a tilt ion implantation. In some embodiments, the method further includes forming a gate trench over the conductive pillar. In some embodiments, etching the epitaxial layer includes performing a dry etching process. In some embodiments, forming the epitaxial layer includes forming the epitaxial layer over the substrate, wherein the substrate has the second conductivity type.

An aspect of this description relates to a super junction structure. The super junction structure includes a substrate, wherein the substrate has a first conductivity type. The super junction structure includes an epitaxial layer over the substrate, wherein the epitaxial layer has a second conductivity type opposite the first conductivity type. The super junction structure further includes a bury layer between the epitaxial layer and the substrate, wherein the bury layer has the second conductivity type. The super junction structure further includes a conductive pillar in the epitaxial layer, wherein the conductive pillar has the first conductivity type, sidewalls of the conductive pillar are angled with respect to a top-most surface of the epitaxial layer, a bottom surface of the conductive pillar is rounded, and a top-most surface of the conductive pillar is coplanar with the top-most surface of the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a super junction structure, the method comprising:
    etching a material to define a trench, wherein the trench has a tapered profile;
    implanting dopants into sidewalls and a bottom surface of the trench to define a doped region, wherein the doped region surrounds the trench;
    depositing an undoped material into the trench; and
    performing a thermal process, wherein the thermal process drives the dopants from the doped region into the undoped material to form a conductive pillar in the trench.

2. The method of claim 1, wherein implanting the dopants comprises performing a vertical ion implantation and a tilt ion implantation.

3. The method of claim 1, wherein depositing the undoped material comprises depositing an undoped polymer.

4. The method of claim 1, wherein depositing the undoped material comprises filling the trench with the undoped material.

5. The method of claim 4, further comprising performing a planarization process to remove the undoped material outside of the trench.

6. The method of claim 1, wherein performing the thermal process comprises forming a rounded bottom surface of the conductive pillar.

7. The method of claim 1, wherein etching the material comprises etching a substrate having a first conductivity type, and performing the thermal process comprises forming the conductive pillar having a second conductivity type opposite the first conductivity type.

8. The method of claim 1, wherein etching the material comprises etching an epitaxial layer over a substrate, the epitaxial layer has a first conductivity type, and performing the thermal process comprises forming the conductive pillar having a second conductivity type opposite the first conductivity type.

9. The method of claim 8, further comprising forming the epitaxial layer over the substrate.

10. The method of claim 9, further comprising forming a bury layer between the epitaxial layer and the substrate, wherein the bury layer has the first conductivity type, and the substrate has the second conductivity type.

11. A method of manufacturing a super junction structure, the method comprising:
- forming an epitaxial layer over a substrate, wherein the epitaxial layer has a first conductivity type;
- etching the epitaxial layer to define a trench, wherein sidewalls of the trench are angled with respect to a top-most surface of the epitaxial layer, and a bottom surface of the trench is parallel to the top-most surface of the epitaxial layer;
- implanting dopants into the sidewalls and the bottom surface of the trench to define a doped region, wherein a top surface of the doped region is coplanar with the top-most surface of the epitaxial layer, and the dopants are a second conductivity type opposite the first conductivity type;
- filling the trench with an undoped material; and
- driving the dopants from the doped region into the undoped material to form a conductive pillar filling the trench.

12. The method of claim 11, wherein driving the dopants from the doped region into the undoped material comprises performing a thermal process.

13. The method of claim 12, wherein performing the thermal process comprises forming a rounded bottom surface of the conductive pillar.

14. The method of claim 11, further comprising forming a bury layer between the substrate and the epitaxial layer, wherein the bury layer has the first conductivity type.

15. The method of claim 14, further comprising electrically connecting the bury layer to a top source/drain electrode.

16. The method of claim 11, wherein implanting the dopants comprises:
- performing a vertical ion implantation; and
- performing a tilt ion implantation.

17. The method of claim 11, further comprising forming a gate trench over the conductive pillar.

18. The method of claim 11, wherein etching the epitaxial layer comprises performing a dry etching process.

19. The method of claim 11, wherein forming the epitaxial layer comprises forming the epitaxial layer over the substrate, wherein the substrate has the second conductivity type.

20. A method of manufacturing a super junction structure, the method comprising:
- etching a material to define a trench, wherein the trench has a tapered profile and a flat bottom surface;
- implanting dopants into sidewalls and a bottom surface of the trench to define a doped region, wherein the doped region surrounds the trench;
- depositing an undoped material into the trench; and
- performing a thermal process, wherein the thermal process drives the dopants from the doped region into the undoped material to form a conductive pillar in the trench, and the thermal process forms a rounded bottom surface of the conductive pillar.

* * * * *